United States Patent [19]
Dalvi et al.

[11] Patent Number: 6,035,401
[45] Date of Patent: *Mar. 7, 2000

[54] BLOCK LOCKING APPARATUS FOR FLASH MEMORY

[75] Inventors: Vishram Prakash Dalvi, Folsom; Rodney R. Rozman, Placerville; Christopher John Haid, Folsom; Jerry Kreifels, El Dorado Hills; Joseph Tsang; Jeff Evertt, both of Folsom; Jahanshir J. Javanifard, Sacramento; Jeffrey J. Peterson, Folsom, all of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/794,283

[22] Filed: Feb. 3, 1997

[51] Int. Cl.[7] ........................................ G06F 11/00
[52] U.S. Cl. ............................ 713/200; 711/163
[58] Field of Search .................. 395/188.01, 186; 711/152, 103, 163, 164; 380/3, 4, 23, 25; 340/825.3; 364/479.03

[56] References Cited

U.S. PATENT DOCUMENTS

| | | |
|---|---|---|
| 4,589,092 | 5/1986 | Matick ..................... 364/900 |
| 4,897,662 | 1/1990 | Lee et al. .................. 343/701 |
| 5,134,384 | 7/1992 | Kokubun ................. 340/146.2 |
| 5,293,424 | 3/1994 | Holtey et al. ............... 380/23 |
| 5,325,430 | 6/1994 | Smyth et al. ................ 380/4 |
| 5,394,367 | 2/1995 | Downs et al. ............. 365/195 |
| 5,442,704 | 8/1995 | Holtey et al. ............... 380/23 |
| 5,469,564 | 11/1995 | Junya ................... 395/188.01 |
| 5,509,134 | 4/1996 | Fandrich et al. .......... 395/430 |
| 5,513,136 | 4/1996 | Fundrich et al. ....... 395/185.04 |
| 5,521,602 | 5/1996 | Carroll et al. ............. 342/50 |
| 5,544,098 | 8/1996 | Matsuo et al. .......... 371/21.2 |
| 5,640,347 | 6/1997 | Lin et al. ............. 395/185.04 |

*Primary Examiner*—Robert W. Beausoliel, Jr.
*Attorney, Agent, or Firm*—Blakely, Sokoloff, Taylor & Zafman LLP

[57] ABSTRACT

A flash memory device including a first memory array, a control circuit coupled to the first memory array, and a second independent memory array coupled to the control circuit. The first memory array includes a plurality of memory blocks each having a memory cell. The memory cell may be a nonvolatile flash memory cell. The control circuit controls the programming, erasing, and reading of the memory cells. The second memory array includes a plurality of block lock-bits each corresponding to one of the plurality of memory blocks. The state of each block lock-bit indicates whether the memory cell in the corresponding memory block is locked. The second memory array may also include a master lock-bit that indicates whether the block lock-bits are locked.

18 Claims, 21 Drawing Sheets

BLOCK LOCKING APPARATUS FOR FLASH MEMORY

CROSS-REFERENCE TO RELATED APPLICATONS

This application is related to subject matter in copending U.S. patent application Ser. No. 08/794,840 entitled "METHOD OF PROGRAMMING, ERASING, AND READING BLOCK LOCK-BITS AND A MASTER LOCK-BIT IN A FLASH MEMORY DEVICE", U.S. patent application Ser. No. 08/794,351 entitled "BLOCK LOCKING AND PASSCODE SCHEME FOR FLASH MEMORY". The above referenced applications have the same filing date as this application, and are assigned to the assignee of this application.

FIELD OF THE INVENTION

The present invention relates generally to memory devices and more particularly to locking blocks of memory in a nonvolatile memory device.

BACKGROUND OF THE INVENTION

Nonvolatile semiconductor memories use a variety of semiconductor memory cell designs. One type of memory cell is a "flash" memory cell that is electrically erasable and electrically programmable. Flash memory cells may be programmed, erased or read by a user. Once programmed, flash memory cells retain their data until erased.

For many flash memory applications data integrity is vital. Users typically want to easily load data into a specific memory block and then to "lock" out that block such that its contents cannot be modified under normal operating conditions. Prior flash memory devices include memory blocks and a flash memory cell in each memory block stores a block "lock-bit" that if programmed indicates that the block of flash memory cells may not be altered (programmed or erased).

One disadvantage with this approach is that erasing the block lock-bit in one memory block may erase all of the data stored in that memory block. For example, if the flash memory cell storing the block lock-bit shares a common source line with the other flash memory cells in the memory block, then erasing the block lock-bit may erase the entire memory block. Thus, if a user wants to unlock a memory block to program or erase bits stored in the memory block, then the entire contents of the memory block are erased. The entire memory block is then programmed regardless of the number of bits that had to be changed. This may result in undesirable delay times to change a few bits of data in a previously locked memory block.

Another disadvantage with the prior approach is that a flash memory device having defective memory blocks may draw an undesirable amount of current. For example, when a memory block is determined to contain a defective flash memory cell, the block lock-bit may then be programmed to indicate that the memory block cannot be altered or accessed. That is, the block lock-bit may block out the use of the bad memory block and the flash memory device may continue to partially function using only good memory blocks. However, including the block lock-bit in a defective memory block requires the defective memory block to be powered in order to read the block lock-bit. This may result in an undesirable amount of power drawn by the defective memory block. Additionally, if a defect in a memory block also adversely affects the corresponding block lock-bit, then the flash memory device may not be partially usable.

Another prior approach described in U.S. Pat. No. 5,513,136 of Fandrich et al., stores block lock-bits in spare rows of memory. Each spare row corresponds to a memory block. One disadvantage with this approach is that each of the spare rows are treated as an extra row of its corresponding memory block. In other words, erasing a block lock-bit in a spare row erases all of the data stored in the corresponding memory block.

Another disadvantage of the approach described in U.S. Pat. No. 5,513,136 is that it generally does not support real-time user access to the block lock-bits in each memory block. For example, a user must write a command to the flash memory device that instructs the device to upload a lock-bit state into a corresponding status register. The user must then typically poll the device until the device indicates that the upload operation was complete. The user then issues another command to read the lock-bit information from the status register. The user then has to issue subsequent read commands to read the lock-bit status from each status register corresponding to each memory block. This process may take as long as five to ten microseconds ($\mu$S).

It may be desirable to lock the states of the lock-bits themselves. One prior approach described in U.S. Pat. No. 5,513,136 uses a voltage applied on an external pin (e.g., WP#) to control whether the block lock-bits may be altered. One disadvantage with this approach is that it requires adding an extra pin to the flash memory device.

SUMMARY OF THE INVENTION

One object of the present invention is to provide a flash memory device having improved block locking circuitry.

Another desire of the present invention is to provide improved block locking circuitry such that an entire memory block may not be erased when the corresponding block lock-bit is erased or unlocked.

Another desire of the present invention is to provide improved block locking circuitry wherein the status of the block lock-bits may be read by a user in real-time or substantially faster than in previous block locking implementations.

Another desire of the present invention is to provide improved block locking circuitry that includes a master lock-bit that controls whether the block lock-bits may be altered.

Another desire of the present invention is to provide a primary flash memory array and a secondary independent flash memory array including block lock-bits corresponding to blocks of memory in the primary flash memory array.

A flash memory device is described. The flash memory device includes a first memory array, a control circuit coupled to the first memory array, and a second independent memory array coupled to the control circuit. The first memory array includes a plurality of memory blocks each having a memory cell. The memory cell may be a nonvolatile flash memory cell. The control circuit controls the programming, erasing, and reading of the memory cells. The second memory array includes a plurality of block lock-bits each corresponding to one of the plurality of memory blocks. The state of each block lock-bit indicates whether the memory cell in the corresponding memory block is locked. The second memory array may also include a master lock-bit that indicates whether the block lock-bits are locked.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
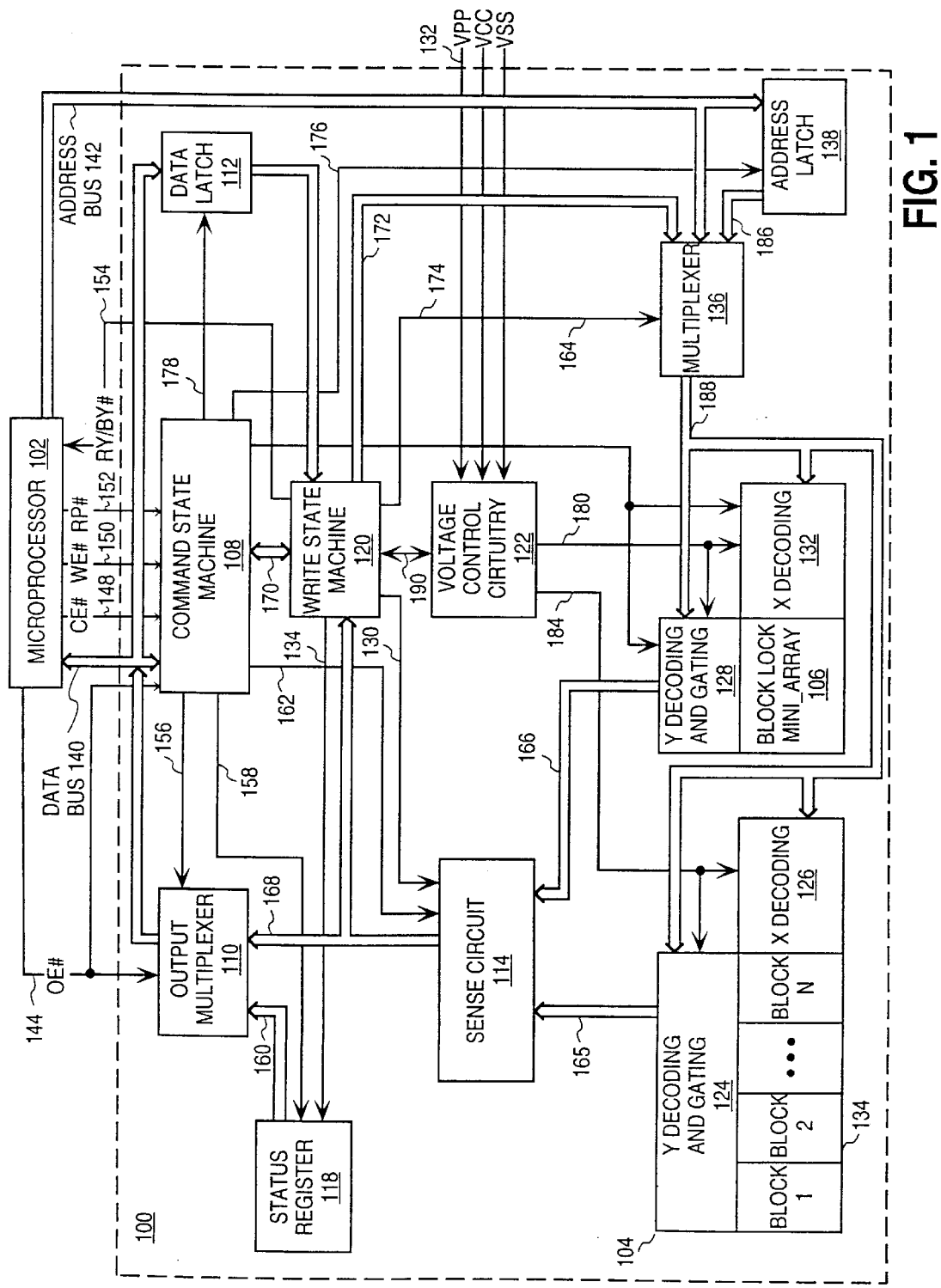
FIG. 1 is a block diagram of one embodiment of the flash memory device including a main flash main array and a flash block lock mini-array storing block lock-bits and a master lock-bit.

FIG. 1 shows flash memory device 100 coupled to microprocessor 102. Flash memory device 100 includes flash memory main array 104, an independent flash block lock mini-array 106, sensing circuit 114, output multiplexer 110, command state machine 108, data latch 112, write state machine 120, voltage control circuitry 122, multiplexer 136, and address latch 138.

As will be described in more detail below, flash main array 104 stores code or data as in a typical flash memory device, and flash block lock mini-array 106 is a separate and independent flash memory array that may store a master lock-bit and a plurality of block lock-bits. Each of the block lock bits may correspond to a separate memory block in flash main array 104. The master lock-bit may control the updating of the block lock-bits, and the block lock-bits may control the updating of corresponding memory blocks in flash main array 104. That is, the master lock-bit may lock the block lock-bits, and the block lock-bits may lock the memory blocks in flash main array 104. Once a block lock-bit is set, memory cells in the corresponding memory block of flash main array 104 may be not programmed or erased unless an override function is enabled. Similarly, once the master lock-bit is set, the block lock-bits may be not programmed or erased unless an override function is enabled. Alternatively, the block lock-bits may inhibit reading of memory cells in a corresponding memory block of flash main array 104, and the master lock-bit may inhibit reading of the block lock-bits.

By placing the plurality of block lock-bits in a separate flash array, the block lock-bits may be erased without erasing the entire contents of a memory block in flash main array 104. Additionally, the status of the block lock-bits and the master lock-bit may be read in approximately real-time and at a substantially higher speed than in some previous designs. For example, the block lock-bits may be read by microprocessor 102 without first storing the block lock-bits in an internal register as described in U.S. Pat. No. 5,513,136.

The master lock-bit may obviate the need for an extra pin on the flash memory device to control access to the lock-bits. Additionally, flash memory device 100 may not need to power up defective memory blocks in flash memory array 104 to determine that the memory block is locked; rather, the block lock-bits may be read independent of accessing flash main array 104.

Flash memory device 100 may be coupled to microprocessor 102 or any other type of controller device or logic (programmable or otherwise) that may generate control, address, and/or data signals for flash memory device 100. For example, microprocessor 102 may be a microcontroller, a state machine, or an application specific integrated circuit (ASIC).

Flash memory device 100 communicates with microprocessor 102 via data bus 140, address bus 142, and control signals coupled to flash memory device 100. The control signals include CE#, OE#, WE#, RP#, and RY/BY#. Other control signals may be provided. The pound symbol "#" following a signal name indicates that the signal is an active low signal. As generally known in the art, any active low signal may alternatively function as an active high signal.

The CE# signal on line 148 is a chip enable signal which may control whether flash memory device 100 is selected for operation. When CE# is active, command state machine 108 may cause other circuit components to be enabled. When CE# is inactive, flash memory device 100 may be deselected and may be placed in a low power state relative to when CE# is active. Flash memory device 100 may be configured to receive multiple CE# signals or other means of selecting and deselecting flash memory device 100 may be used.

The OE# signal on line 144 is an output enable signal for flash memory device 100. When the OE# signal and the CE# signal are both active, the outputs from output multiplexer 110 are coupled to data bus 140 and are gated to microprocessor 102. The data output from output multiplexer 110 may be provided by the status register 118, flash main array 104 via sense circuitry 114, or flash block lock mini-array 106 via sense circuitry 114.

The WE# signal on line 150 is a write enable signal that may control writing of commands to command state machine 108 and/or data latch 112. For one embodiment, when the CE# signal is active, flash memory device 100 latches addresses and data on the rising edge of WE#.

The RP# signal on line 152 is a reset/deep power-down signal. When the RP# signal is active, flash memory device 100 may be placed in a deep power-down mode that may draw considerably less power than when flash memory device 100 is operating in a standby mode or is deselected by the CE# signal. When active, RP# may inhibit programming, erasing, or reading of flash memory array 104 and/or flash block lock mini-array 106. With RP# active, one or all of the internal circuits may be reset to a predetermined state. As will be described in greater detail below, the voltage level of the RP# signal may enable the setting of the master lock-bit, enable configuration of the block lock-bits when the master lock-bit is set, or override the block lock-bits or the master lock-bit.

The RY/BY# signal on line 154 is a ready/busy# signal that may be controlled by write state machine 120. When RY/BY# is low, write state machine 120 is busy performing an internal operation (e.g., programming, erasing, or lock-bit configuration). When RY/BY# is high, write state machine 120 may be ready for new commands or flash memory device 100 may be in a deep power down mode or in a program or erase suspend mode. Microprocessor 102 may poll or periodically check the state of RY/BY# to determine if a lock-bit configuration is complete.

Microprocessor 102 accesses flash memory device 100 by asserting commands or instructions on data bus 140 and addresses on address bus 142. Data bus 140 may include any number of data lines N, and address bus 142 may include any number of address lines M. For one embodiment N is 8 and M is 20.

Flash memory device 100 may be used in any kind of computer or data processing system. A computer system within which flash memory device 100 may be used may be a personal computer, a notebook computer, a laptop computer, a personal assistant/communicator, a minicomputer, a workstation, a mainframe, a multiprocessor computer, or any other type of computer system. In addition, a system in which flash memory device 100 is used may be a printer system, a cellular phone system, a digital answering system, a digital camera, or any other data storage system.

For one embodiment, flash memory device 100 employs MOS circuitry and all the circuitry of flash memory device 100 resides on a single semiconductor substrate.

Flash main array 104 and flash block lock mini-array 106 may include one or more memory blocks. For example, flash main array 104 may include a memory array 134 having memory blocks 1 to N, wherein N may be any number of memory blocks each having any number of rows and columns and any number of flash memory cells. For example, N may be sixteen and each memory block may include 64 Kbytes of memory cells. For another embodiment, N may be 32 and each memory block may include 64 Kbytes of memory cells.

Flash main array 104 may be coupled to X decoding circuitry 126 and Y decoding and gating circuitry 124 to address the memory cells in memory blocks 1 through N. Similarly, flash block lock mini-array 106 may be coupled to X decoding circuitry 132 and Y decoding and gating circuitry 128 to address memory cells in flash block lock mini-array 106. The address of a memory cell in flash main array 104 or flash block lock mini-array 106 may be provided on address bus 188 by multiplexer 136.

Flash block lock mini-array 106 may include flash memory cells for storing the block lock-bits corresponding to the memory blocks 1 to N in flash main array 104. Additionally, flash block lock mini-array 106 may store a master lock-bit that controls whether the block lock-bits may be altered by programming or erasing.

Flash block lock mini-array 106 may be as large as required to store the block lock-bits and the master lock-bit. The master lock-bit and block lock-bits may be stored in any memory cell in any row or column of flash block lock mini-array 106. For one embodiment, flash main array 104 has 16 memory blocks and flash block lock mini-array 106 includes an array of five rows by five columns, wherein four rows and four columns store 16 block lock-bits corresponding to the 16 memory blocks, and a memory cell in the fifth row and the fifth column stores the master lock-bit. For another embodiment, flash memory array 104 may include 16 or 32 memory blocks and flash block lock mini-array 106 may include nine rows and five columns, wherein eight rows and four columns may be used to store the 16 or 32 block lock-bits, and a memory cell in the ninth row and fifth column may be used to store the master lock-bit.

As generally known in the art, flash block lock mini-array 106 may include additional rows and/or columns of unused flash memory cells that may increase the quality and reliability of fabricating the flash memory cells that store the block lock-bits.

In other embodiments, flash block lock mini-array 106 may be any type of nonvolatile or volatile memory. If flash block lock mini-array 106 is volatile memory, then the block lock-bit states and the master lock-bit state may be loaded at power up from a nonvolatile memory device (e.g., hard drive, EEPROM, etc.) or may be generated at power up or reset. For another embodiment, flash block lock mini-array 106 may not be an array of memory cells; rather, it may be register elements or other means of storing the block lock-bits and the master lock-bit. For yet other embodiments, the master lock-bit may be stored in a separate memory or storage element apart from the block lock-bits. For example, the master lock-bit may be stored in write state machine 120.

For another embodiment, flash block lock mini-array may be located external to flash memory device 100.

Figure 2:
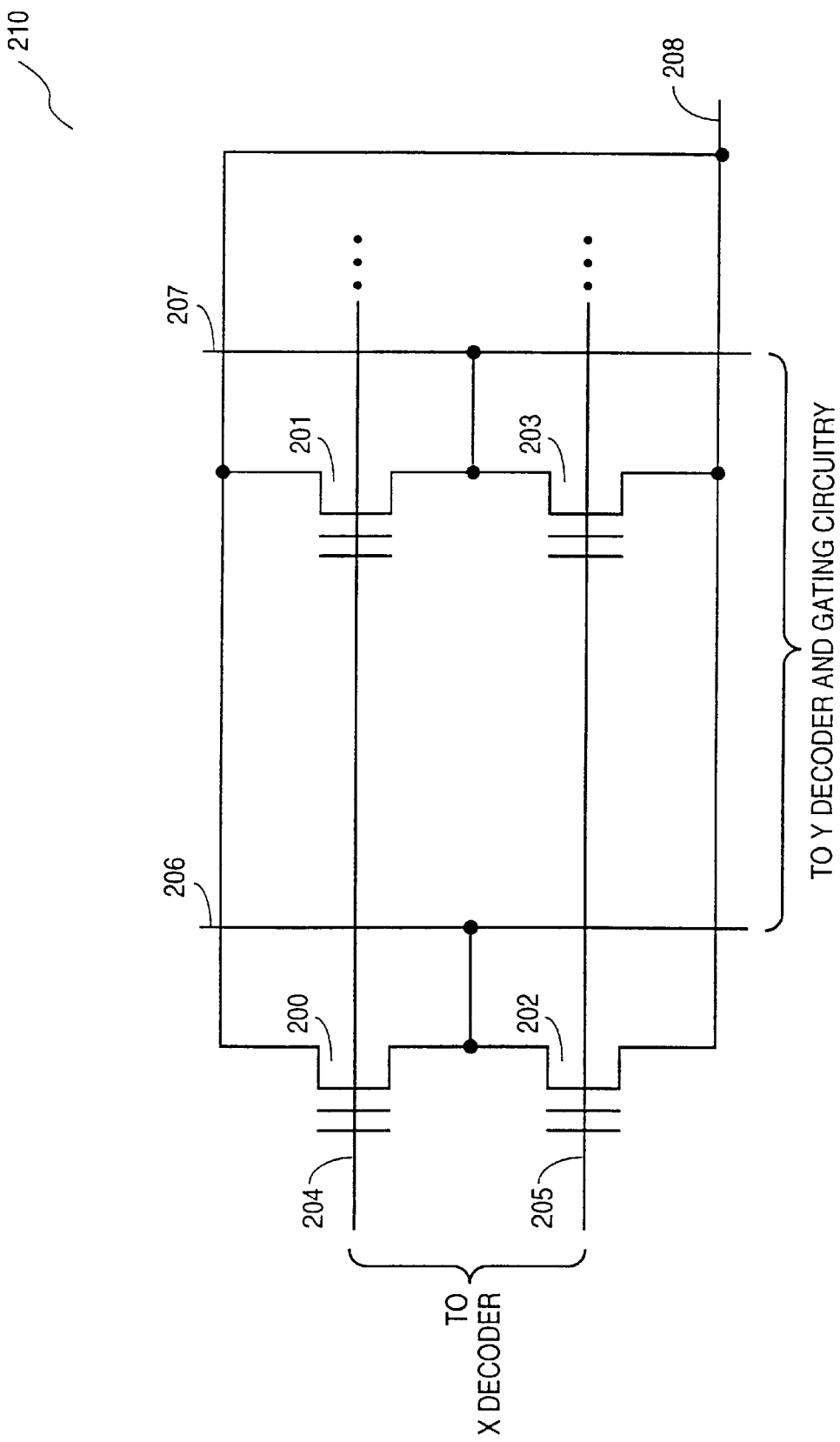
FIG. 2 is one embodiment of a block of flash memory cells.

FIG. 2 illustrates flash memory block 210 that is one embodiment of a flash memory block that may be used in flash main array 104 or flash block lock mini-array 106. Flash memory block 210 includes four flash memory cells organized in two rows and two columns. Flash memory cells 200–203 are formed at the intersection of word lines 204 and 205 and bit lines 206 and 207. Word lines 204 and 205 may be coupled to X decoder 126 or X decoder 132. Each word line is coupled to the gate of all memory cells in a particular row. For example, the gates of flash memory cells 200 and 201 are coupled to word line 204, and the gates of flash memory cells 202 and 203 are coupled to word line 205. Bit lines 206 and 207 may be coupled to Y decoding and gating circuits 124 or 128. Each bit line is coupled to the drain of all flash memory cells in a particular column. For example, the drains of flash memory cells 200 and 202 are coupled to bit line 206, and the drains of flash memory cells 201 and 203 are coupled to bit line 207. The sources of all flash memory cells in a particular memory block are coupled to a common source line. For example, the sources of flash memory cells 200–203 are connected to common source line 208.

Figure 3:
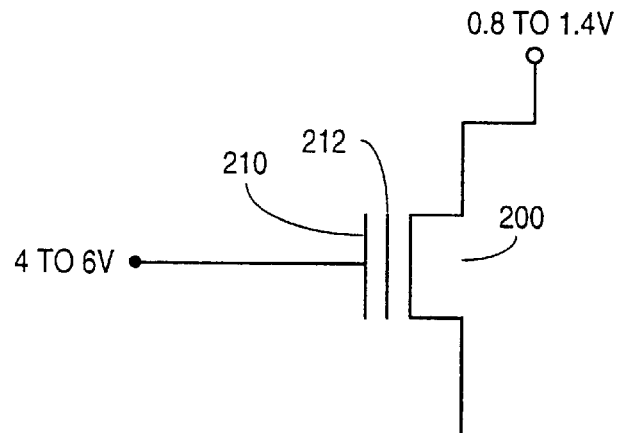
FIG. 3 is a circuit diagram of one embodiment of voltages necessary to read data stored in a flash memory cell.
Figure 4:
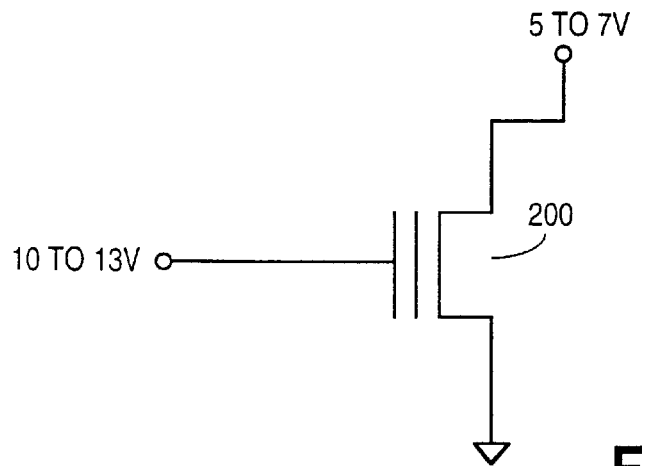
FIG. 4 is a circuit diagram of one embodiment of voltages necessary to program a flash memory cell.
Figure 5:
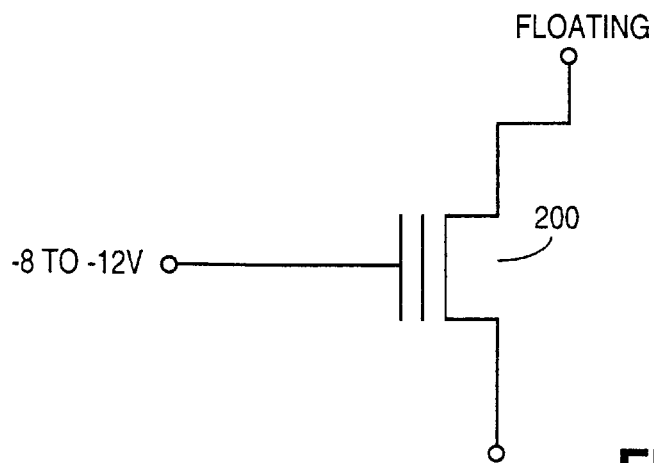
FIG. 5 is a circuit diagram of one embodiment of voltages necessary to erase a flash memory cell.

A flash memory cell may be programmed, erased, or read by applying the appropriate voltages to the word lines, bit lines, and source line. FIGS. 3–5 illustrate typical voltages that may be applied to the terminals of exemplary flash memory cell 200 to program, erase, and read the flash memory cell. The appropriate voltages may be supplied by voltage control circuitry 122, Y decoding and gating circuits 124 and 128, or X decoding circuits 126 and 132. Flash memory cell 200 includes select gate 210 and electrically isolated floating gate 212 that traps charge and stores data. As generally known in the art, other voltages may be used to program, erase, or read flash memory cell 200.

FIG. 3 illustrates one embodiment of read voltages for flash memory cell 200. Data may be read from memory cell 200 by applying approximately 4.0 V to 6.0 V to select gate 210, approximately 0.8 V to 2.0 V to the drain, and ground to the common source line. The amount of current flowing through flash memory cell 200 may then be sensed by sensing circuitry to determine the data stored in flash memory cell 200. Reading the state of the flash memory cell typically does not disturb the state of the data stored in the flash memory cell.

FIG. 4 illustrates one embodiment of programming voltages for flash memory cell 200. Data may be programmed to memory cell 200 by applying approximately 10.0 V to 13.0 V to select gate 210, approximately 5.0 V to 7.0 V to the drain, and ground to the common source line. The high voltage of 10.0 V to 13.0 V may be applied on the VPP signal line 182. Programming typically results in a logic zero state to be stored in the flash memory cell. Multiple states may also be programmed in a given flash memory cell.

FIG. 5 illustrates one embodiment of erase voltages for flash memory cell 200. Data may be erased by applying approximately −8.0 V to −12.0 V to select gate 210, floating the drain, and applying approximately 4.0 V to 6.0 V to the common source line. The negative voltages applied to select gate 210 may be applied on VPP or may be generated by voltage control circuitry 122. Alternatively, other ranges of voltages may be used to erase flash memory cell 200. For example, approximately 0 V may be applied to select gate 210 and approximately 9.0 V to 12.0 V may be applied to the common source line.

Erasing typically results in a logic one state to be stored in the flash memory cell. Erasing the state of one flash memory cell erases the data stored on all flash memory cells having a source coupled to the common source line in the memory block.

With respect to FIG. 1, data read from flash main array 104 is coupled to sense circuit 114 via bus 165. Similarly, data read from flash block lock mini-array 106 is coupled to sense circuit 114 via bus 166. Sense circuit 114 senses the state of the data and provides the data to output multiplexer 110 and write state machine 120 via bus 168. Write state machine 120 and/or command state machine 108 may control whether sense circuit 114 is enabled to sense data from flash main array 104 or from flash block lock mini-array 106.

For one embodiment, one byte of data is read from flash main array 104 at one time (e.g., eight bits), and sense circuit 114 has eight sense amplifiers. The byte of sense amplifiers may sense the data read from flash main array 104 or may sense one or more of the block lock-bits read from flash block lock mini-array 106. For another embodiment, sense circuit 114 may include additional sense amplifiers (e.g., two) for sensing repair columns or rows in flash main array 104 and for sensing the block lock-bits in flash block lock mini-array 106.

For yet another embodiment, sense circuit 114 may include two sense circuits. The first sense circuit may be dedicated to flash main array 104 and the second sense circuit may be dedicated to flash block lock mini-array 106. Write state machine 120 and/or command state machine 108 may control which sense circuit is enabled at the appropriate time.

Flash memory device 100 also includes control circuitry that includes command state machine 108, data latch 112, write state machine 120, voltage control circuitry 122, multiplexer 136 and address latch 138. The control circuitry may be used to program, erase, and read data or lock-bit information from flash main array 104 and flash block lock mini-array 106, respectively.

Flash memory device 100 includes a command state machine 108 that may function as the interface between microprocessor 102 and flash memory device 100. Commands issued by microprocessor 102 on data bus 140 may be latched by command state machine 108 or in data latch 112 (by a control signal on line 178). Command state machine 108 decodes the commands and generates signals used by other circuits in flash memory device 100 in order to perform the commands. Command state machine 108 may be a microcontroller, programmable logic, ROM, RAM, and ASIC, or any type of logic necessary to decode commands and generate the necessary signals to perform a given command.

When microprocessor 102 issues a read command, command state machine 108 may send a signal on line 156 to enable output multiplexer 110. For one embodiment, command state machine 108 may send one or more signals on line(s) 158 to cause the data stored in status register 118 to be provided to output multiplexer 110 via bus 160. Alternatively, command state machine 108 may send one or more signals on line 162 to enable reading from a memory cell in flash main array 104 from an address supplied by address latch 138 and multiplexer 136. For this embodiment, sense circuit 114 may be enabled to sense the data accessed in flash main array 104 and provide the sensed data to output multiplexer 110 via bus 168. For another embodiment, command state machine 108 may send one or more signals on line 162 and/or line 164 to enable reading of the state of a lock-bit in flash block lock mini-array 106 from an address supplied by address latch 138 and multiplexer 136. For this embodiment, sense circuit 114 may be enabled to sense the lock-bit accessed in flash block lock mini-array 106 and provide the sensed data to output multiplexer 110 via bus 168.

When microprocessor 102 issues a program or erase command, command state machine 108 sends one or more signals to write state machine 120 via bus 170. Write state machine 120 may then begin a sequence of steps to perform the program or erase function. Write state machine 120 performs "write" or configuration sequences, such as programming and erasure, to update the states of the flash memory cells in flash main array 104 or flash block lock mini-array 106. Write state machine 120 may perform program and erase sequences by controlling the voltages provided to flash main array 104 and flash block lock mini-array 104 through voltage control circuitry 122. One embodiment of write state machine 120 includes a microcontroller that uses microcode to control the sequence of steps to program or erase data in flash main array 104 or block lock-bits and the master lock-bit in flash block lock mini-array 106. For another embodiment, write state machine 120 may be programmable logic, ROM, RAM, an ASIC or any other logic that may perform the necessary sequences of steps required to program or erase data or lock-bits in flash main array 104 and flash block lock mini-array 106, respectively.

After a program or erase operation, status register 118 may be updated to reflect if the operation was completed successfully. Status register 118 may include any number of bits. For one embodiment, status register 118 includes eight bits.

Voltage control circuitry 122 generates the required voltages necessary to program, erase, or read data or lock-bits from flash main array 104 or flash block lock mini-array 106, respectively. Voltage control circuitry 122 may receive VPP, VCC (power supply voltage), and VSS (ground). VCC and VSS may be supplied to all circuits of flash memory device 100. For one embodiment, VCC may be range from approximately 2.7 V to 3.6 V. For another embodiment, VCC may range from approximately 4.5 V to 5.5 V. Other VCC ranges may be used.

Voltage control circuitry 122 may include negative voltage switching circuitry for supplying negative voltages to main array 134 or block lock mini-array 104.

Figure 6:
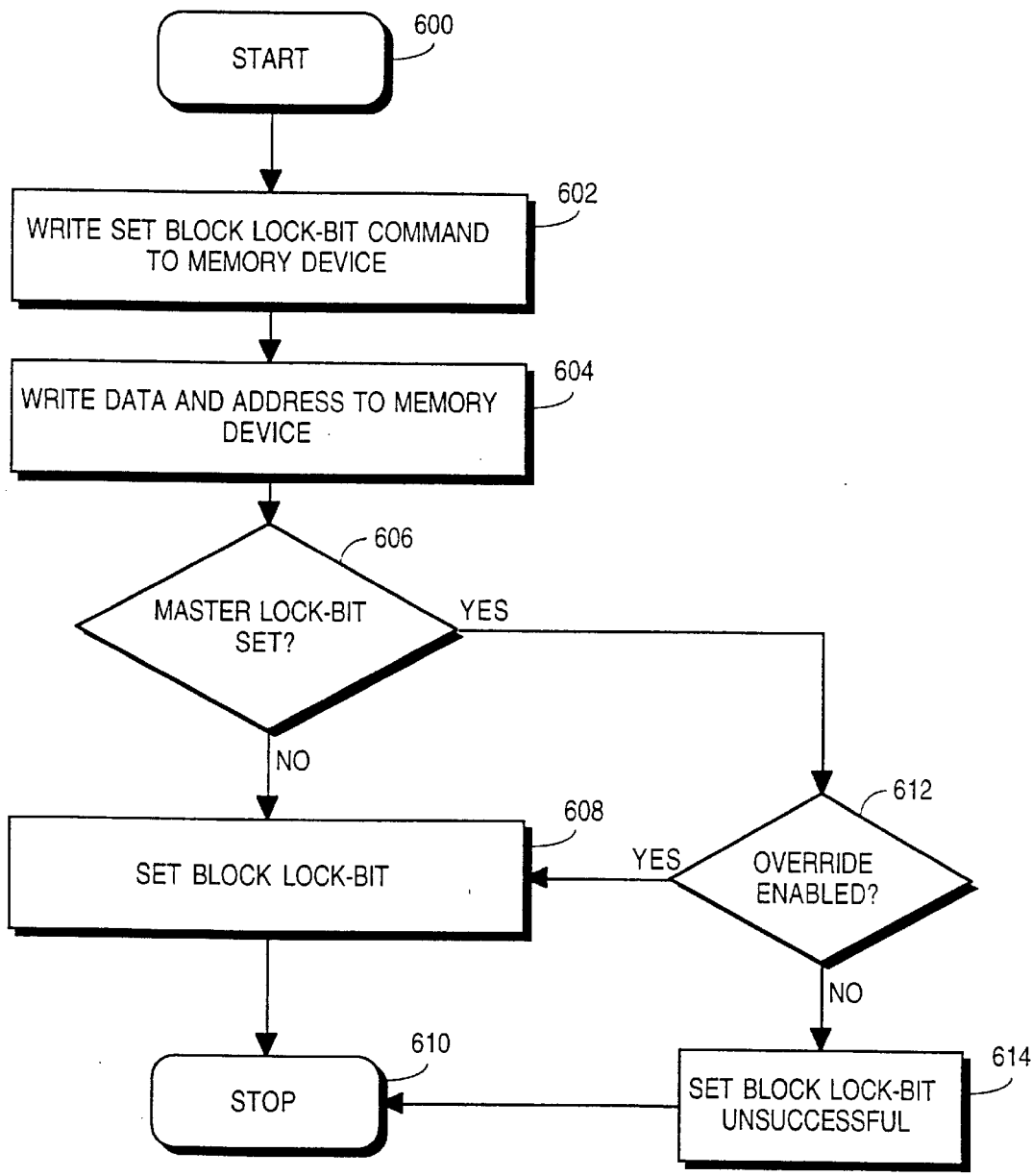
FIG. 6 is a flow chart of one embodiment of programming a block lock-bit.

One or more block lock-bits may be programmed as generally illustrated in the flow chart of FIG. 6. Programming or setting a block lock-bit in flash block lock mini-array 106 inhibits the writing (i.e., altering, updating, etc.) of memory cell data stored in corresponding memory blocks of flash main array 104.

The process begins at step 600. At step 602, microprocessor 102 issues a SET BLOCK LOCK-BIT command to flash memory device 100 via data bus 140. Command state machine 108 may then decode the command. Microprocessor 102 may then supply an address for the appropriate block lock-bit and data to be written into the block lock-bit at step 604. At step 606, command state machine 108 and/or write state machine 120 may determine if the master lock-bit is set indicating that the block lock-bit may not be altered. If the master lock-bit is set, then the process determines if an override function is enabled at step 612. The override function may enable a user to update block lock-bits even though the master lock-bit is set. If the override function is enabled or the master lock-bit is not set, then at step 608 the block lock-bit is set and the process stops a step 610. If the override is disabled, then the SET BLOCK LOCK-BIT command is unsuccessful as indicated at step 614, and the process stops at step 610.

The process illustrated in FIG. 6 may be used to program a single block lock-bit at a particular address in flash block lock mini-array 106. For an alternative embodiment, multiple block lock-bits may be programmed at one time. For example, a particular address or command may be issued by microprocessor 102 that indicates that multiple block lock-bits should be programmed.

Figure 7:
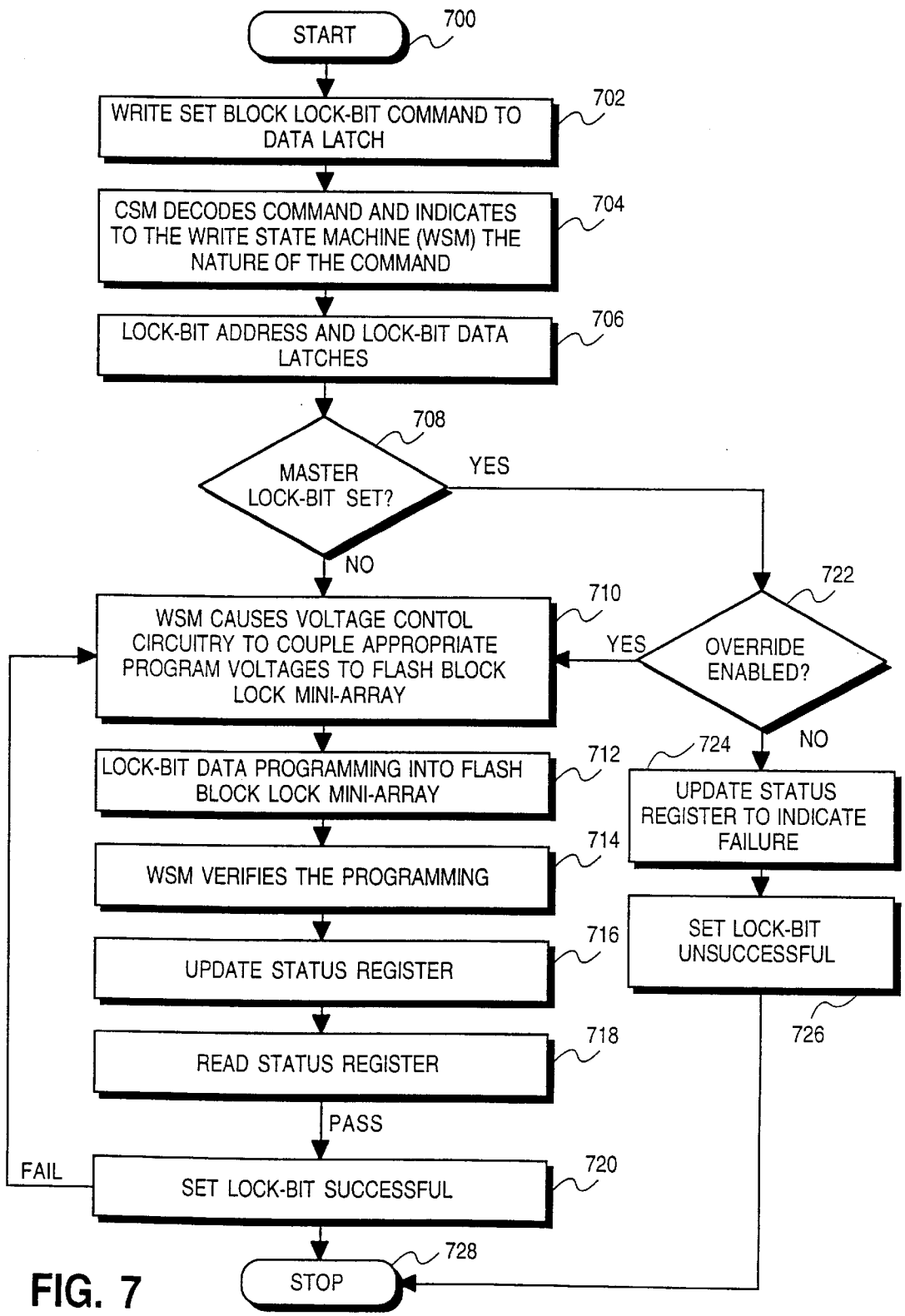
FIG. 7 is a flow chart of another embodiment of programming a block lock-bit.

FIG. 7 illustrates a more detailed embodiment of programming a block lock-bit in flash memory device 100. The process begins at step 700. At step 702, microprocessor 102 issues the SET BLOCK LOCK-BIT command on data bus 140. The command may be latched into data latch 112 by a control signal on line 178, or may be latched by command state machine (CSM) 108. For one example, the command may be 60H (where "H" refers to hexadecimal base numbers). At the same time, the address for the block lock-bit may be supplied on address bus 142 and latched into address latch 138 by control signal 176.

The address of a block lock-bit may be supplied by the least significant bits, the most significant bits, or any combination of bits on address bus 142. For one embodiment, flash main array 104 has sixteen memory blocks of 64 Kbytes each, and the most significant four bits of the address bus are used to select each of the different memory blocks and may be decoded to address corresponding block lock-bits in flash block lock mini-array 106. For example, if the most significant four bits are 0111, then these bits may be decoded to address a block lock-bit that corresponds to memory block seven in flash main array 104. Similarly, if the most significant four bits are 1101, then these bits may be decoded to address a block lock-bit that corresponds to memory block thirteen in flash main array 104.

For another embodiment, the block lock bits may be addressed using both the most significant bits and the least significant bits on address bus 142. For one embodiment, flash main array 104 has sixteen memory blocks of 64 Kbytes each, and the block lock-bit addresses (in hexadecimal notation) for each of the sixteen block lock-bits in flash block lock mini-array 106 may be as illustrated in Table 1. Other block lock-bit addresses may be used.

For yet another embodiment, only the most significant bits may be used to select the appropriate block lock-bit for programming, and the most significant bits and the least significant bits may both be used to select the appropriate block lock-bit for reading.

TABLE 1

| Block Lock-Bit | Memory Block in Flash Main Array 104 | Block Lock-Bit Address |
|---|---|---|
| 1 | 1 | 00002 |
| 2 | 2 | 10002 |
| 3 | 3 | 20002 |
| 4 | 4 | 30002 |
| 5 | 5 | 40002 |
| 6 | 6 | 50002 |
| 7 | 7 | 60002 |
| 8 | 8 | 70002 |
| 9 | 9 | 80002 |
| 10 | 10 | 90002 |
| 11 | 11 | A0002 |
| 12 | 12 | B0002 |
| 13 | 13 | C0002 |
| 14 | 14 | D0002 |
| 15 | 15 | E0002 |
| 16 | 16 | F0002 |

At step 704, command state machine 108 decodes the command and sends a command lock block signal (e.g., CDLKBLK) on bus 170 to write state machine (WSM) 120. This signal causes write state machine 120 to prepare to program the specified block lock-bit in flash block lock mini-array 106.

At step 706, microprocessor 102 may write the block lock-bit address on address bus 142 and data on data bus 140. The data indicates that the block lock-bit should be set or programmed. The data may be latched into data latch 112 or may be latched by command state machine 108. The address may be latched in address latch 138. For one embodiment, a logic one state on the least significant bit of data bus 140 indicates that the specified block lock-bit should be programmed. For example, the data may be 01H. Other combinations of bits may be used.

Steps 702 and 706 may be a two bus cycle command issued by microprocessor 102. Step 702 may be issued in the first bus cycle and step 704 may be issued in the second bus cycle.

At step 708, flash memory device 100 determines if the master lock-bit in flash block lock mini-array 106 is set. If the master lock-bit is set, then the programming of the block lock-bit will be inhibited unless an override function is enabled. If the master lock-bit is not set, then the block lock-bit may be programmed.

Figure 8:
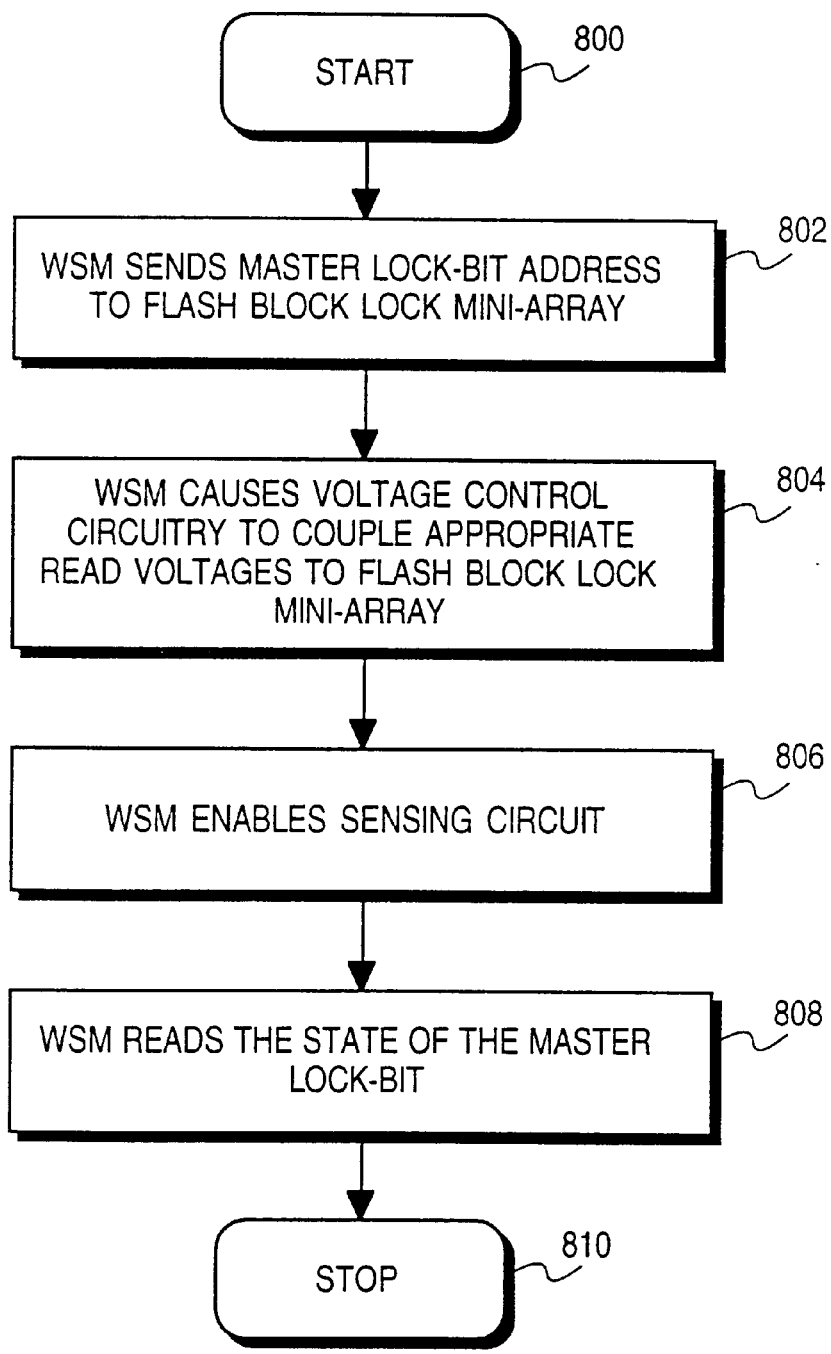
FIG. 8 is a flow chart of one embodiment of determining if the master lock-bit is set.

FIG. 8 illustrates one embodiment of determining if the master lock-bit is set. The process starts at step 800. At step 802, write state machine 120 sends the master lock-bit address on bus 172 to multiplexer 136. Write state machine 120 also may send a control signal on line 174 such that multiplexer 136 couples the address on bus 172 to flash block lock mini-array 106. At step 804, write state machine 120 may then cause voltage control circuitry 122 to couple appropriate read voltages to the addressed master lock-bit of flash block lock mini-array 106. At step 806, write state machine 120 may then enable sense circuit 114 via control line 130 to sense the master lock-bit information from Y decoding and gating circuitry 128. At step 808, write state machine 120 reads the state of the master lock-bit from sense circuit 114 via bus 168. The process stops at step 810.

With reference to FIG. 7, if write state machine 120 determines that the master lock-bit is not set, then write state machine 120 causes voltage control circuitry 122 to couple the appropriate programming voltages to flash block lock mini-array 106 at step 710. The programming voltages may be coupled to Y decoding and gating circuitry 128 and X decoding circuitry 132 via line(s) 180. Write state machine 120 may also send the control signal on line 174 such that multiplexer 136 couples the selected block lock-bit address to Y decoding and gating circuitry 128 and X decoding circuitry 132 from address latch 138.

At step 712, the addressed block lock-bit may then be programmed. At step 714, write state machine 120 may optionally verify the programming of the block lock-bit by reading the contents of the addressed block lock-bit. At step 716, status register 118 may then be updated to reflect that the programming of the block lock-bit has been completed, and may reflect whether the programming was completed successfully.

Microprocessor 102 may monitor the voltage level of the output signal RY/BY# to determine when the programming of the block lock-bit has been completed. Alternatively, microprocessor 102 may read a bit in status register 118 (e.g., bit 7) that indicates whether write state machine 120 is busy or has completed the programming operation. Microprocessor 102 may read the contents of status register 118 via output multiplexer 110 and data bus 140.

Status register 118 may also include a bit (e.g., bit 4) that indicates whether the programming of the block lock-bit has been completed successfully. For example, if this bit is set, then the block lock-bit programming was not completed successfully. If this bit is not set, then the programming of the block lock-bit was completed successfully.

Status register 118 may also include another bit (e.g., bit 3) that indicates whether the programming voltage applied on VPP during the programming of the block lock-bit was within an acceptable voltage range (see, for example, FIG. 4). For example, if this bit is set, then the programming voltage on VPP was not within the acceptable voltage range. If this bit is not set, then the programming voltage on VPP was within the acceptable voltage range. For another embodiment, VPP may be in a range from approximately 3.0 V to 13.0 V when VCC is in a range of approximately 3.0 V to 3.6 V. For yet another embodiment, VPP may be in a range from approximately 10.0 V to 13.0 V when VCC is in a range of approximately 4.5 V to 5.5 V.

Status register 118 may include other bits of information regarding operation of flash memory device 100 including bits that will be discussed in detail below.

After the status register has been updated at step 716, microprocessor 102 may read the status register to determine if the programming of the block lock-bit was successful at step 718. If status register 118 indicates the programming was unsuccessful, then the process may repeat steps 710–718 a predetermined number of times or until the programming is successful. If status register 118 indicates that the programming of the block lock-bit was successful at step 720, then the process stops at step 728.

If write state machine 120 determines at step 708 that the master lock-bit is set, then the process determines if the master lock-bit override is enabled at step 722. The master lock-bit override enables a user to update or alter the states of the block lock-bits even though the master lock-bit is set.

One embodiment for overriding the master lock-bit is to place a particular voltage within a range of voltages on one of the control signals provided to flash memory device 100. For example, during the loading of the SET BLOCK LOCK-BIT command at step 702, a high voltage (e.g., VHH) may be coupled to RP# on line 152. For one embodiment, the high voltage may be from approximately 11.0 V to approximately 13.0 V. Other low or high voltage ranges may be used on RP# or other pins to effectuate the same result. If the override is enabled, then the process transitions to step 710 and proceeds as previously described. If the override is not enabled, then the status register is updated at step 724 and the process is determined to be unsuccessful at step 726. The process then stops at step 728.

For another embodiment, a passcode may be used to override the master lock-bit as described in more detail with reference to FIGS. 18–23 below.

For one embodiment, one bit of the status register (e.g., bit 1) may indicate that the SET BLOCK LOCK-BIT command was unsuccessful and aborted because the master lock-bit was set and the override was not enabled. For example, if this bit is set, the master lock-bit was set and the override was not enable. If this bit is not set, the master lock-bit was not set or the override was enabled.

Figure 9:
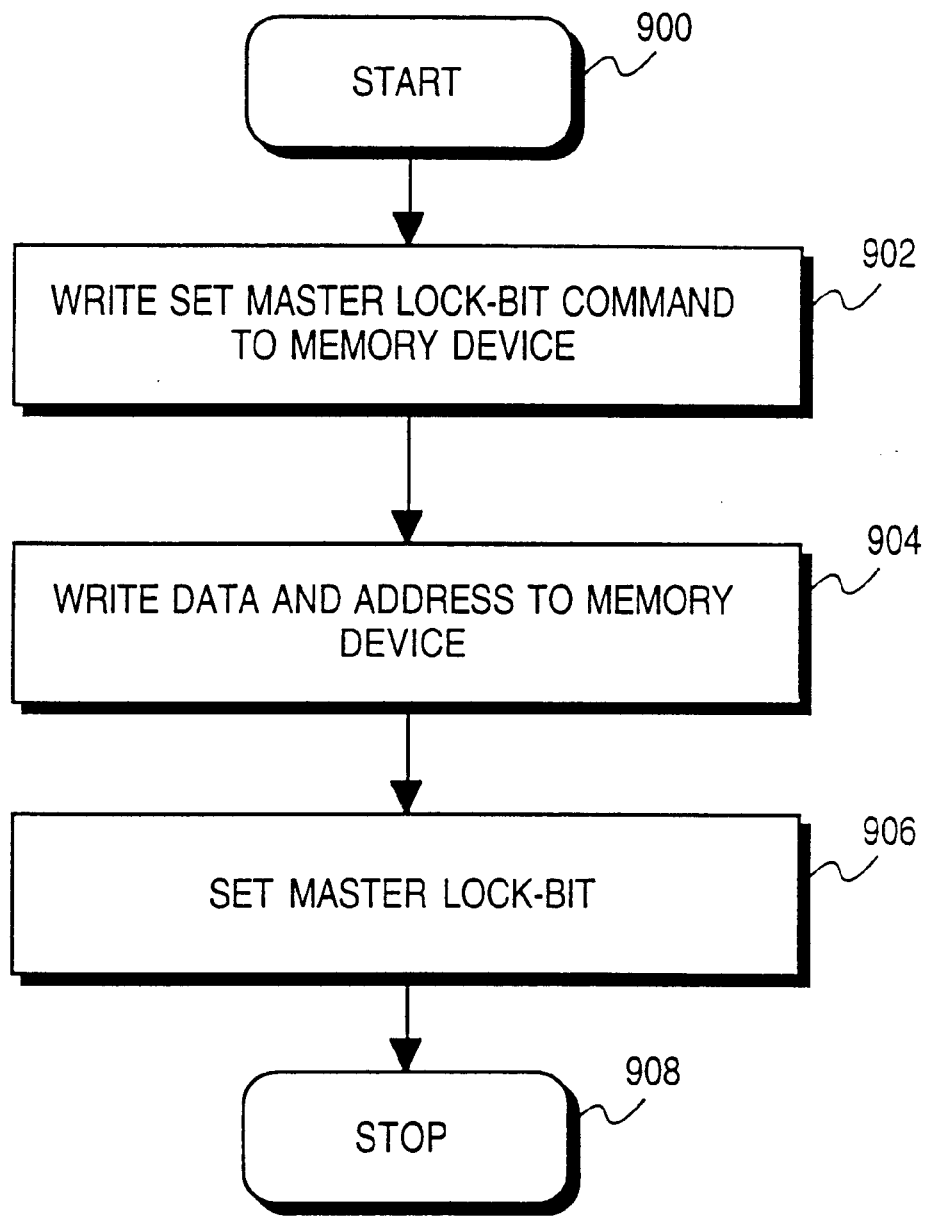
FIG. 9 is a flow chart of one embodiment of programming the master lock-bit.

The master lock-bit may be programmed as generally illustrated in the flow chart of FIG. 9. Programming or setting the master lock-bit locks the block lock-bits inhibiting the altering or updating of the block lock-bits stored in flash block array 106.

The process begins at step 900. At step 902, microprocessor 102 issues a SET MASTER LOCK-BIT command to flash memory device 100 via data bus 140. Command state machine 108 may then decode the command. Microprocessor 102 may then supply an address for the master lock-bit and data to be written into the master lock-bit at step 904. At step 906, write state machine 120 may then cause voltage circuitry 122 to couple programming voltages to flash block lock mini-array 106 to program or set the master lock-bit. The process then stops at step 908.

For one embodiment, once the master lock-bit has been set it may not be erased or cleared. This feature may be useful in applications that load particular code into flash main array 104 and then do not want the data changed thereafter.

For another embodiment, the master lock-bit may be erased or cleared by providing a voltage level in a particular range on a control signal provided to flash memory device 100. For example, placing a high voltage on RP# may enable a user to erase or clear the master lock-bit. For one embodiment, the high voltage may be from approximately 11.0 V to 13.0 V.

For yet another embodiment, the master lock-bit may be erased or cleared in a similar fashion as the block lock-bit as will be described in more detail below.

Figure 10:
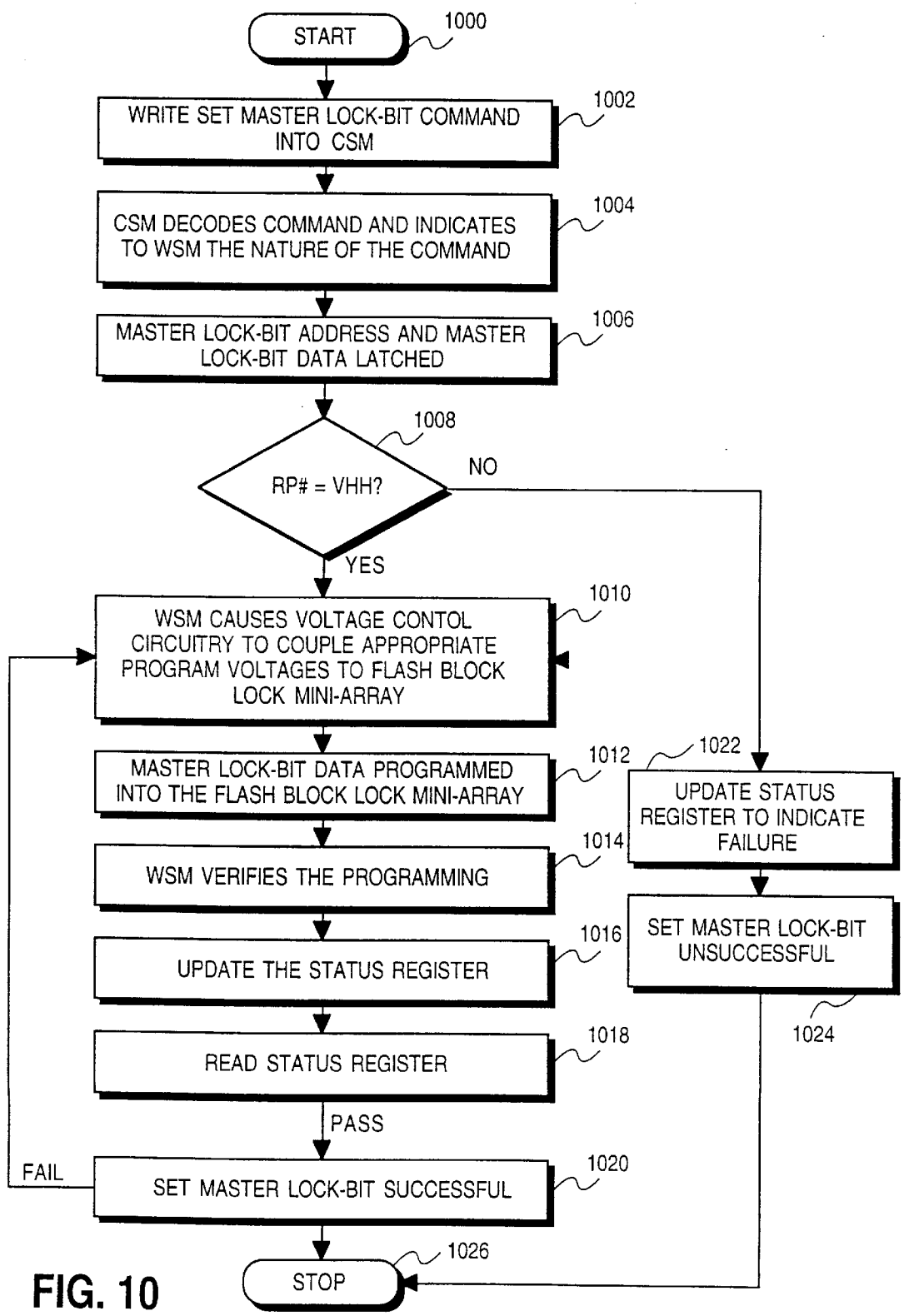
FIG. 10 is a flow chart of another embodiment of programming the master lock bit

FIG. 10 illustrates a more detailed embodiment of programming the master lock-bit in flash memory device 100. The process begins at step 1000. At step 1002, microprocessor 102 issues the SET MASTER LOCK-BIT command on data bus 140. The command may be latched into data latch 112 by a control signal on line 178, or may be latched by command state machine 108. For one example, the command may be 60H. At the same time, the address for the master lock-bit may be supplied on address bus 142 and latched into address latch 138 by control signal 176.

The address of the master lock-bit may have a particular memory address within the address space covered by flash memory device 100. For one embodiment, the master lock-bit may have an address of 00003H.

At step 1004, command state machine 108 decodes the command and sends a command lock block (e.g., CDLKBLK) signal on bus 170 to write state machine 120. This signal causes write state machine 120 to prepare to program the master lock-bit in flash block lock mini-array 106.

At step 1006, microprocessor 102 may write the master lock-bit address on address bus 142 and data on data bus 140. The data indicates that the master lock-bit should be set or programmed. The data may be latched into data latch 112 or latched by command state machine 108. The address may be latched in address latch 138. For one embodiment, the data may be F1H. Other data may be used.

Steps 1002 and 1006 may be a two bus cycle command issued by microprocessor 102. Step 1002 may be issued in the first bus cycle and step 1006 may be issued in the second bus cycle.

At step 1008, flash memory device 100 determines if the proper programming voltage (e.g., VHH) is supplied on RP# for programming the master lock-bit. This may be determined by command state machine 108, write state machine 120, or other voltage detection circuitry. For one embodiment, the voltage level on RP# must be within a range of voltages during step 1002 in order to program the master lock-bit. For example, the voltage on RP# may be in the range from approximately 10.0 V to approximately 13.0 V. An elevated voltage range may be used so that the master lock-bit is not inadvertently programmed. For other embodiments, other voltage ranges may be used. For yet another embodiment, the voltage level on RP# may not affect the programming of the master lock-bit.

If RP# is within the proper programming range, then write state machine 120 causes voltage control circuitry 122 to couple the appropriate programming voltages to flash block lock mini-array 106 at step 1010. The programming voltages may be coupled to Y decoding and gating circuitry 128 and X decoding circuitry 132 via line(s) 180. Write state machine 120 may also send the control signal on line 174 such that multiplexer 136 couples the master lock-bit address to Y decoding and gating circuitry 128 and X decoding circuitry 132 from address latch 138.

At step 1012, the addressed master lock-bit may then be programmed. At step 1014, write state machine 120 may optionally verify the programming of the master lock-bit by reading the contents of the addressed master lock-bit. At step 1016, status register 118 may then be updated to reflect that the programming of the master lock-bit has been completed, and may reflect whether the programming was completed successfully.

Microprocessor 102 may monitor the voltage level of the output signal RY/BY# to determine when the programming of the master lock-bit has been completed. Alternatively, microprocessor 102 may read a bit in status register 118 (e.g., bit 7) that indicates whether write state machine 120 is busy. Microprocessor 102 may read the contents of status register 118 via output multiplexer 110 and data bus 140.

Status register 118 may also include a bit (e.g., bit 4) that indicates whether the programming of the master lock-bit has been completed successfully. For example, if this bit is set, then the master lock-bit programming was unsuccessful. If this bit is not set, then the programming of the master lock-bit was successful. Programming of the master lock-bit may be unsuccessful due to, for example, failing verifying step 1014, or RP# being outside the acceptable range of voltages (e.g., VHH).

Status register 118 may also include another bit (e.g., bit 3) that indicates whether the programming voltage applied on VPP during the programming of the master lock-bit was within an acceptable voltage range. For example, if this bit is set, then the programming voltage on VPP was not within the acceptable voltage range. If this bit is not set, then the programming voltage on VPP was within the acceptable voltage range.

Status register 118 may include other bits of information regarding operation of flash memory device 100 including bits that will be discussed in detail below.

After the status register has been updated at step 1016, microprocessor 102 may read the status register to determine if the programming of the master lock-bit was successful at step 1018. If status register 118 indicates the programming was unsuccessful, then the process may repeat steps 1010–1018 a predetermined number of times or until the programming is successful. If status register 118 indicates that the programming of the master lock-bit was successful at step 1020, then the process stops at step 1026.

If write state machine 120 determines at step 1008 that the RP# is not within the acceptable range of voltages, then the process updates the status register at step 1022 to reflect that the SET MASTER LOCK-BIT command was unsuccessful or aborted. For one embodiment, one bit of the status register (e.g., bit 1) may indicate that the SET MASTER LOCK-BIT command was unsuccessful or aborted. If status register 118 indicates that the programming of the master lock-bit was unsuccessful at step 1024, then the process stops at step 1026.

Figure 11:
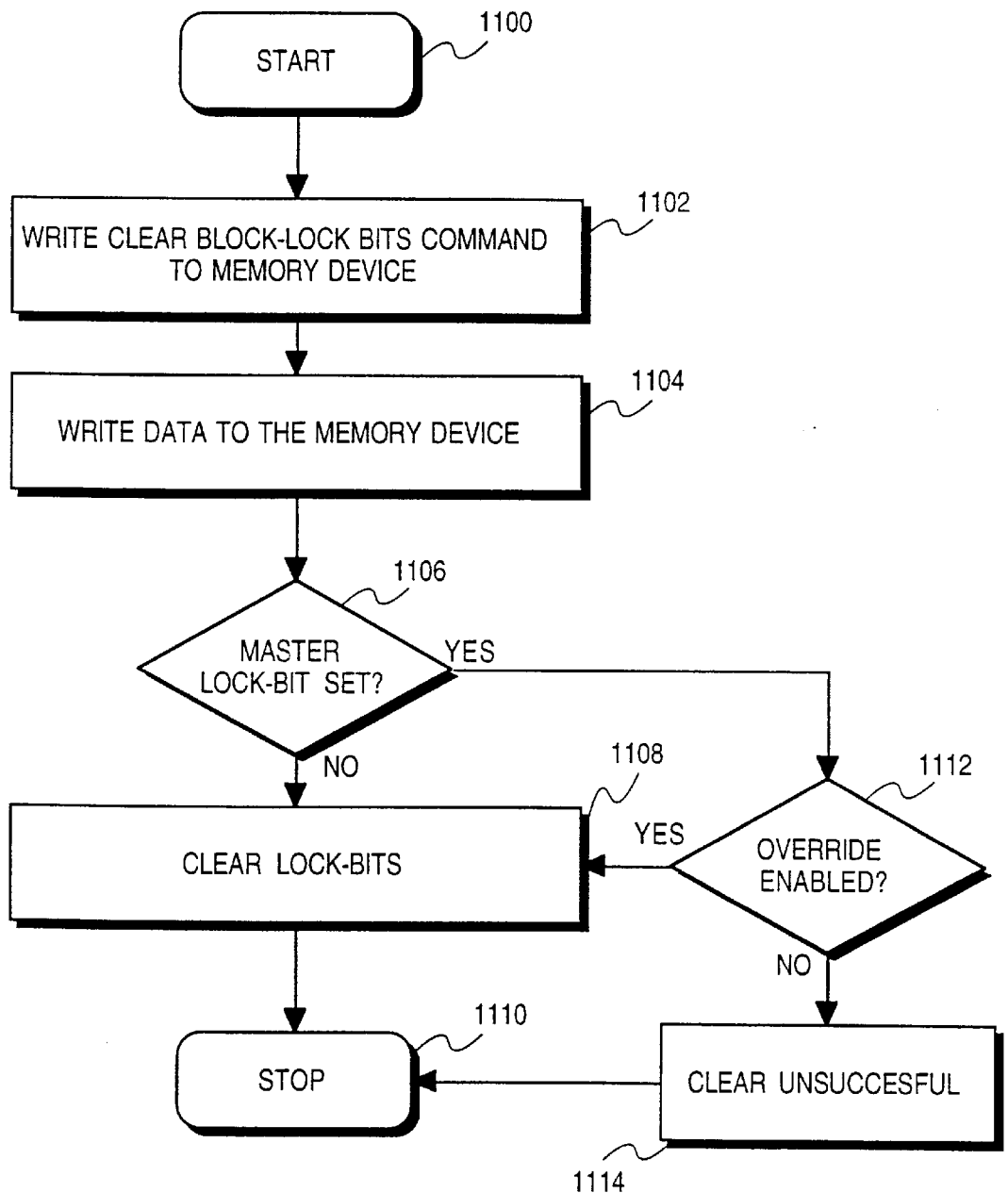
FIG. 11 is a flow chart of one embodiment erasing block lock-bits.

The process of erasing or clearing one or more block lock-bits in flash block lock mini-array 106 may be as generally illustrated in the flow chart of FIG. 11. Erasing or clearing a block lock-bit enables the memory cells in the corresponding memory block of flash main array 104 to be programmed or erased.

The process begins at step 1100. At step 1102, microprocessor 102 issues a CLEAR BLOCK LOCK-BITS command to flash memory device 100 via data bus 140. Command state machine 108 may then decode the command. Microprocessor 102 may then supply data to flash memory device 100 at step 1104. At step 1106, command state machine 108 and/or write state machine 120 may determine if the master lock-bit is set indicating that the block lock-bit may not be altered. If the master lock-bit is set, then the process determines if an override function is enabled at step 1112. The override function may enable a user to erase block lock-bits even though the master lock-bit is set. If the override function is enabled or the master lock-bit is not set, then at step 1108 the block lock-bits are erased and the process stops at step 1110. If the override is disabled, then the CLEAR BLOCK LOCK-BITS command is unsuccessful as indicated at step 1114, and the process stops at step 1110.

The process illustrated in FIG. 11 clears all of the block lock-bits in flash block lock mini-array 106 because the block lock-bits are stored in one block of flash memory cells in flash block lock mini-array 106. For an alternative embodiment, at least one, but not all, of the block lock-bits may be erased at one time by, for example, decoupling the source terminals of the flash memory cells storing the block lock-bits. Alternatively, if the block lock-bits are stored in another type of nonvolatile memory device, or a volatile memory device (e.g., a register), then block lock-bits may be erased individually or in groups as generally known in the art.

Figure 12:
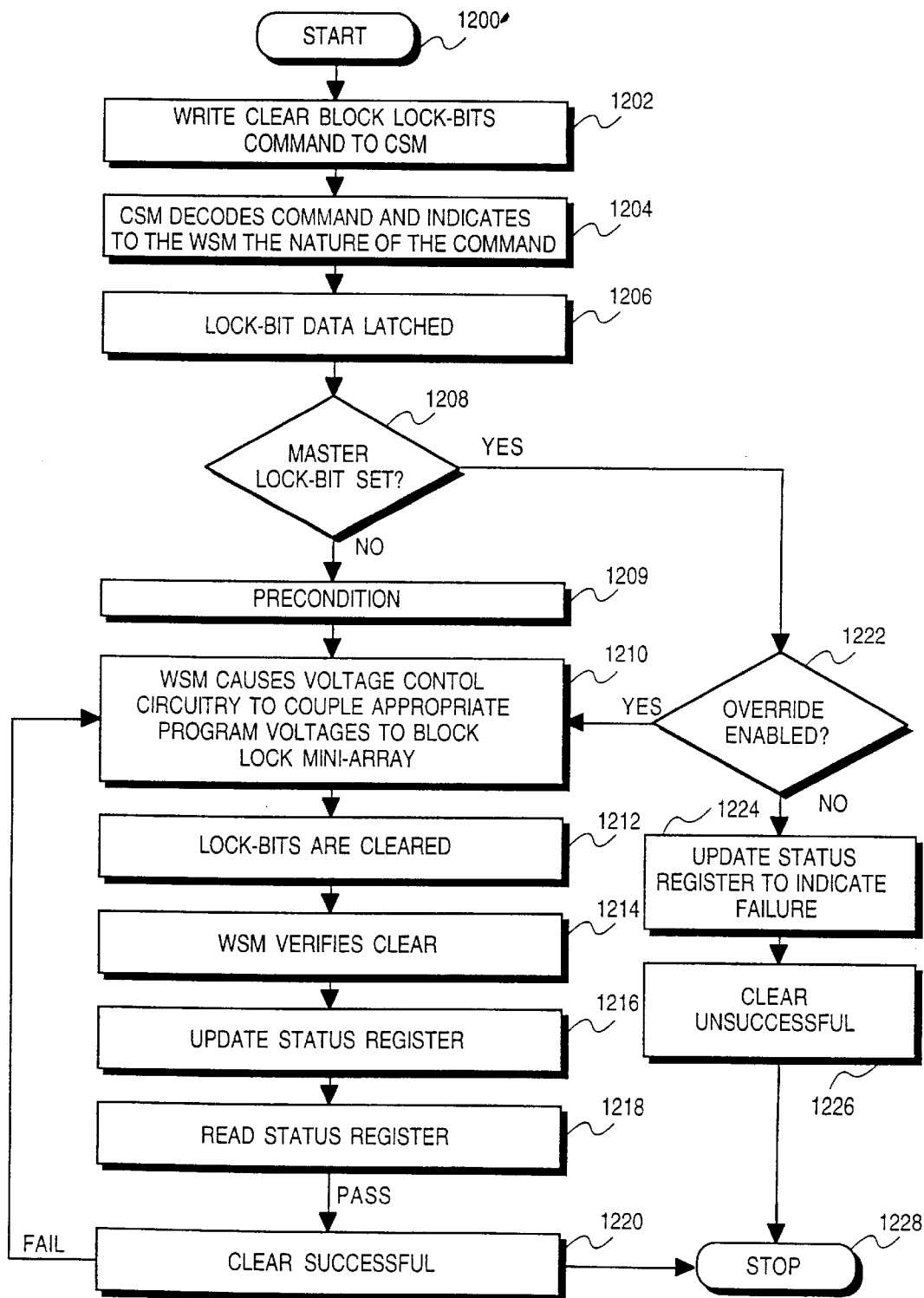
FIG. 12 is a flow chart of another embodiment of erasing a block lock-bit.

FIG. 12 illustrates a more detailed embodiment of erasing or clearing block lock-bits in flash block lock mini-array 106. The process begins at step 1200. At step 1202, microprocessor 102 issues the CLEAR BLOCK LOCK-BITS command on data bus 140. The command may be latched into data latch 112 by a control signal on line 178, or may be latched by command state machine 108. For one example, the command may be 60H. No address for the block lock-bits is required because all of the block lock-bits will be erased. For an alternative embodiment, an address for the block lock-bit to be erased may be supplied on address bus 142 and latched into address latch 138 by control signal 176. If an address of a block lock-bit is supplied, it may be supplied as described with respect to programming a block lock-bit above.

At step 1204, command state machine 108 decodes the command and sends a signal on bus 170 to write state machine 120. This signal causes write state machine 120 to prepare to erase the block lock-bits in flash block lock mini-array 106.

At step 1206, microprocessor 102 may write data on data bus 140 to indicate that the block lock-bits should be erased. The data may be latched into data latch 112 or may be latched by command state machine 108. An address, if supplied, may be latched in address latch 138. For one embodiment, a logic zero state on the least significant bit of data bus 140 indicates that the block lock-bits should be erased. For example, the data may be D0H. Other combinations of bits may be used.

Steps 1202 and 1206 may be a two bus cycle command issued by microprocessor 102. Step 1202 may be issued in the first bus cycle and step 1206 may be issued in the second bus cycle.

At step 1208, flash memory device 100 determines if the master lock-bit in flash block lock mini-array 106 is set. If the master lock-bit is set, then the erasing of the block lock-bits will be inhibited unless an override function is enabled. If the master lock-bit is not set, then the block lock-bits may be erased. One embodiment for determining the state of the master lock-bit is illustrated in FIG. 8.

If write state machine 120 determines that the master lock-bit is not set, then write state machine 120 may optionally cause flash block lock mini-array 106 to be subjected to a precondition step before erasing one or more block lock-bits in flash block lock mini-array 106. The precondition step programs each flash memory cell prior to erasing each cell. For one embodiment, the precondition step may include, on a bit-by-bit basis (i.e., flash memory cell by flash memory cell basis), verifying or reading the state of each flash memory cell to determine if it is already programmed. If a flash cell is already programmed then it may not be re-programmed. If a flash cell is not already programmed, write state machine 120 may then cause the flash memory cell to be programmed and verified for a predetermined number of times, or until the flash memory cell has been programmed successfully (i.e., verifies). For another embodiment, write state machine 120 may program the entire flash block lock mini-array 106 regardless of whether a particular flash memory cell has been programmed before. Each flash memory cell may then be verified. If any flash memory cell fails the verification step, then the flash memory cell may then be programmed and verified for a predetermined number of times, or until the flash memory cell has been programmed successfully (i.e., verifies). Other precondition methods may be used.

At step 1210, write state machine 120 causes voltage control circuitry 122 to couple the appropriate erasing voltages to flash block lock mini-array 106 at step 1210. The erasing voltages may be coupled to Y decoding and gating circuitry 128 and X decoding circuitry 132 via line(s) 180. Write state machine 120 may also send the control signal on line 174 such that multiplexer 136 couples a block lock-bit address (if supplied) to Y decoding and gating circuitry 128 and X decoding circuitry 132 from address latch 138.

At step 1212, the block lock-bits (or addressed block lock-bit) may then be erased. At step 1214, write state machine 120 may optionally verify the erasing of the block lock-bits by reading the contents of the block lock-bits. For another embodiment, write state machine 120 may optionally verify the erasing of an addressed block lock-bit by reading the contents of the selected block lock-bit. At step 1216, status register 118 may then be updated to reflect that the erasing of the block lock-bits has been completed, and may reflect whether the erasing has been completed successfully.

Microprocessor 102 may monitor the voltage level of the output signal RY/BY# to determine when the erasing of the block lock-bit has been completed. Alternatively, microprocessor 102 may read a bit in status register 118 (e.g., bit 7) that indicates whether write state machine 120 is busy or has completed the erasing operation. Microprocessor 102 may read the contents of status register 118 via output multiplexer 110 and data bus 140.

Status register 118 may also include a bit (e.g., bit 4) that indicates whether the erasing of the block lock-bits has been completed successfully. For example, if this bit is set, then the erasing of the block lock-bits was not completed successfully. If this bit is not set, then the erasing of the block lock-bits was completed successfully.

Status register 118 may also include another bit (e.g., bit 3) that indicates whether the programming voltage applied on VPP during the erasing of the block lock-bits was within an acceptable voltage range. For example, if this bit is set, then the programming voltage on VPP was not within the acceptable voltage range. If this bit is not set, then the programming voltage on VPP was within the acceptable voltage range. For one embodiment, VPP may be within a negative voltage range as illustrated in FIG. 5. For another embodiment, VPP may be in a range from approximately 3.0 V to 13.0 V when VCC is in a range of approximately 3.0 V to 3.6 V. For yet another embodiment, VPP may be in a range from approximately 10.0 V to 13.0 V when VCC is in a range of approximately 4.5 V to 5.5 V.

Status register 118 may include other bits of information regarding operation of flash memory device 100 including bits that will be discussed in detail below.

After the status register has been updated at step 1216, microprocessor 102 may read the status register to determine if the erasing of the block lock-bits was successful at step 1218. If status register 118 indicates the programming was unsuccessful, then the process may repeat steps 1210–1218 a predetermined number of times or until the programming is successful. If status register 118 indicates that the programming of the block lock-bit was successful at step 1220, then the process stops at step 1228.

If write state machine 120 determines at step 1208 that the master lock-bit is set, then the process determines if the master lock-bit override is enabled at step 1222. The master lock-bit override enables a user to update or erase the states of the block lock-bits even though the master lock-bit is set.

One embodiment for overriding the master lock-bit is to place a particular voltage within a range of voltages on one of the control signals provided to flash memory device 100. For example, during the loading of the CLEAR BLOCK LOCK-BITS command at step 1202, a high voltage (e.g., VHH) may be coupled to RP# on line 152. For one embodiment, the high voltage may be from approximately 11.0 V to approximately 13.0 V. Other low or high voltage ranges may be used on RP# or other pins to effectuate the same result. If the override is enabled, then the process transitions to step 1210 and proceeds as previously described. If the override is not enabled, then the status register is updated at step 1224 and the process is determined to be unsuccessful at step 1226. The process stops at step 1228.

For another embodiment, a passcode may be used to override the master lock-bit as described in more detail with reference to FIGS. 18–23 below.

For one embodiment, one bit of the status register (e.g., bit 1) may indicate that the CLEAR BLOCK LOCK-BITS command was unsuccessful and aborted because the master lock-bit was set and the override was not enabled. For example, if this bit is set, the master lock-bit was set and the override was not enable. If this bit is not set, the master lock-bit was not set or the override was enabled.

For one embodiment, once the master lock-bit has been set it may not be erased or cleared. This feature may be useful in applications that load particular code into flash main array 104 and then do not want the data changed thereafter.

For another embodiment, the master lock-bit may be erased or cleared by providing a voltage level in a particular range on a control signal provided to flash memory device 100. For example, placing a high voltage on RP# may enable a user to erase or clear the master lock-bit. For one embodiment, the high voltage may be from approximately 11.0 V to 13.0 V.

Clearing the master lock-bit may erase all of the block lock-bits in flash block lock mini-array 106. Alternatively, the master lock-bit may be stored in a flash memory cell that has a source terminal that is not coupled to the source terminals of the flash memory cells storing the block lock-bits. Thus, erasing the master lock-bit may not erase the block lock-bits.

For yet another embodiment, the master lock-bit may be erased or cleared in a similar fashion as the block lock-bits as described in FIGS. 11 and 12. The master lock-bit may be erased using the same command as erasing the block lock-bits, or by using a different command.

Figure 13:
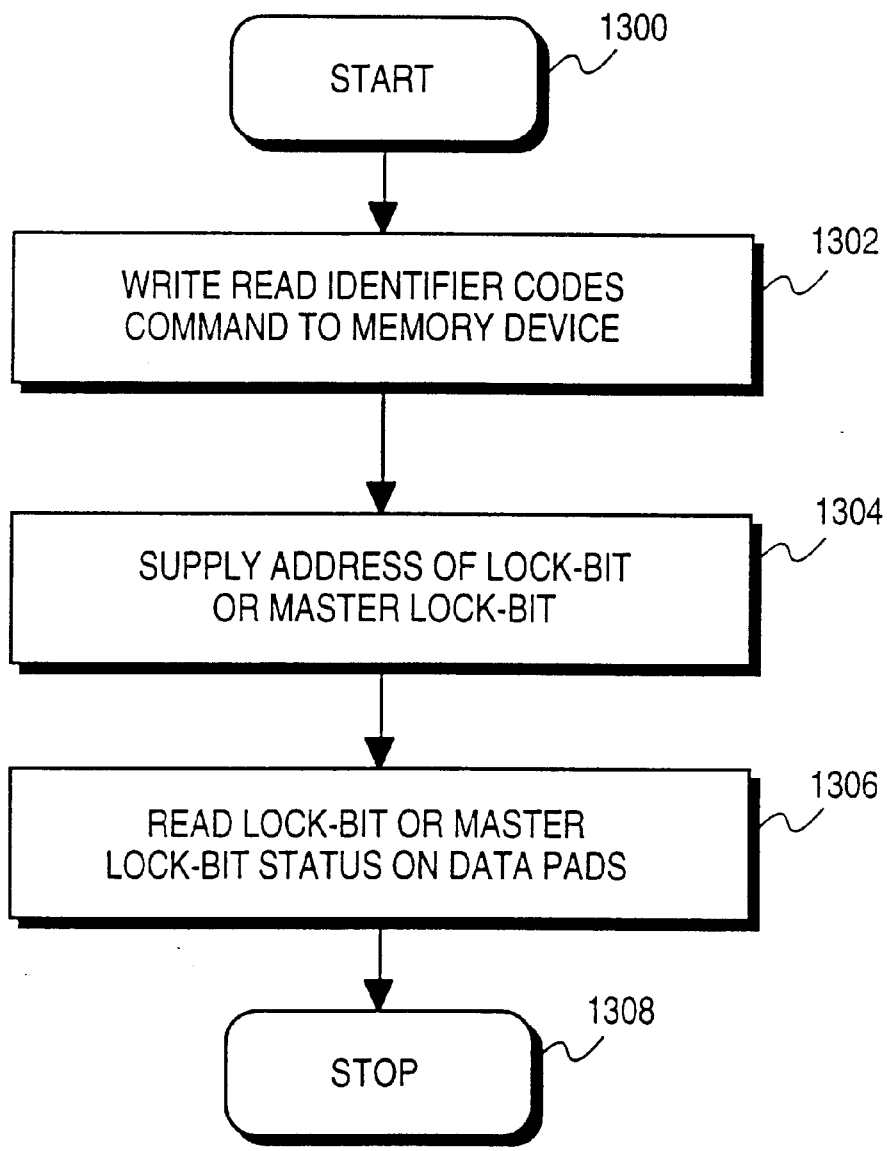
FIG. 13 is a flow chart of reading a block lock bit.

The process of reading one or more block lock-bits or the master lock-bit from flash block lock mini-array 106 may be as generally illustrated in the flow chart of FIG. 13.

The process begins at step 1300. At step 1302, microprocessor 102 issues a READ IDENTIFIER CODES command to flash memory device 100 via data bus 140. Command state machine 108 may then decode the command. Microprocessor 102 may then supply an address for the appropriate block lock-bit or master lock-bit at step 1304. At step 1306, the appropriate block lock-bit or master lock-bit is accessed in flash block lock mini-array 106 and is supplied onto data bus 140.

Each of the block lock-bits may be read sequentially, or they may be read in parallel. The block lock-bits may also be read in substantially real-time. For example, from the time that the address is supplied to flash memory device 100 at step 1304, a block lock-bit state may be read, in one embodiment, in as fast as 90 nanoseconds (nS) or 120 nS. This is a significant increase in speed over the approximately 5 to 10 $\mu$S of conventional designs.

Figure 14:
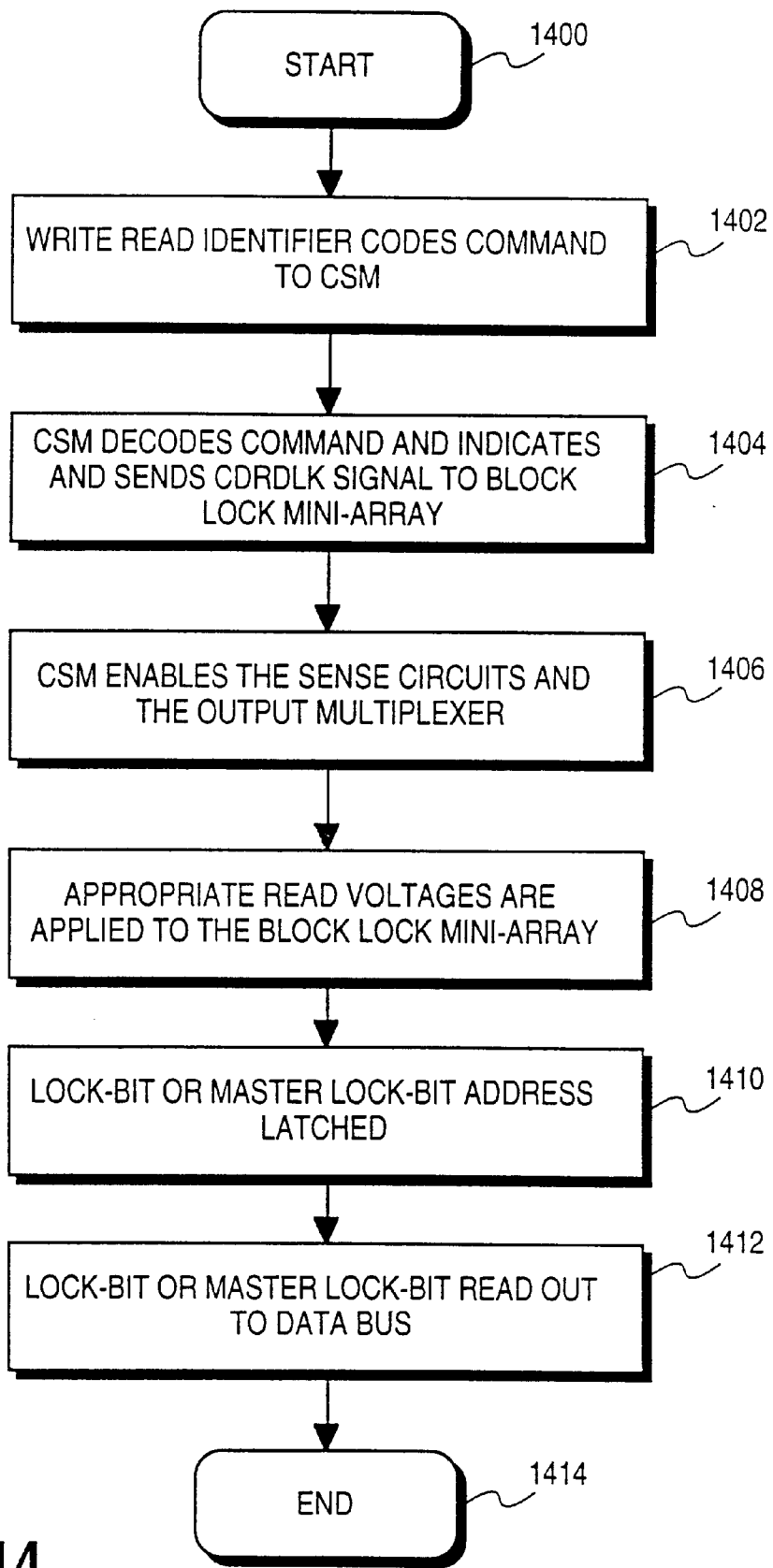
FIG. 14 is a flow chart of another embodiment of reading a block lock-bit.

FIG. 14 illustrates a more detailed embodiment of reading one of the block lock-bits or the master lock-bit from flash block lock mini-array 106. The process begins at step 1400. At step 1402, microprocessor 102 issues the READ IDENTIFIER CODES command on data bus 140. The command may be latched into data latch 112 by a control signal on line 178, or may be latched by command state machine 108. For one example, the command may be 90H.

At step 1404, command state machine 108 decodes the command and sends a command read lock signal (e.g., CDRDLCK) on line(s) 164 to enable Y decoding and gating circuitry 128 and X decoding circuitry 132.

At step 1406, command state machine 108 enables sense circuit 114 to sense the block lock-bit data read from flash block lock mini-array 106, and couple the data to output multiplexer 110 via bus 168. Sense circuit 114 may be enabled by CDRDLCK on line 162 or by another signal or signals. Command state machine 108 may also send a control signal on line 156 to enable output multiplexer 110 to output the block lock-bit sensed by sense circuit 114 to data bus 140.

At step 1408, the appropriate read voltages may be applied to flash block lock mini-array 106 as illustrated, for example, in FIG. 2. The voltages may be applied by voltage control circuitry 122, by multiplexer 136, or by other generally known read circuits.

At step 1410, the block lock-bit or master lock-bit address may be latched on address bus 142 into address latch 138. Alternatively, the address may be supplied directly to multiplexer 136. Multiplexer 136 may couple the address from address latch 138 to Y decoding and gating circuitry 128 and X decoding circuitry 132 in response to a control signal on line 174, or in response to a control signal from command state machine 108 (not shown).

The addresses of the block lock-bits and the master lock-bit may be previously described with respect to FIGS. 7 (including Table 1) and 10, respectively.

Steps 1402 and 1410 may be a two bus cycle command issued by microprocessor 102. Step 1402 may be issued in the first bus cycle and step 1410 may be issued in the second bus cycle. Additionally, different addresses may be supplied in subsequent bus cycles without re-issuing the READ IDENTIFIER CODES command.

At step 1412, microprocessor 102 reads the data supplied on data bus 140 and may determine the state of the addressed block lock-bit or master lock-bit. For one embodiment, the least significant bit of data bus 140 indicates whether a block lock-bit or master lock-bit is set or not set. For example, if the least significant bit is a logic zero state, then the block lock-bit is not set. Thus, the corresponding block in flash main array 104 is not blocked. If the least significant bit is a logic one state, then the block lock-bit is set. Thus, the corresponding block in flash main array 104 is blocked. Similarly, if least significant bit is a logic zero state, then the master lock-bit is not set. Thus, the block lock-bits are not blocked and may be altered. If the least significant bit is a logic one state, then the master lock-bit is set. Thus, the block lock-bits in are blocked and may not be altered.

Alternatively, other bits may be used to indicate the status of the block lock-bits or the master lock-bits. Additionally, each of the data bits read from data bus 140 may represent the status of one of the block lock-bits and/or the master lock-bit.

For one embodiment, the READ IDENTIFIER CODES command may operate independently of the VPP voltage and the voltage level on RP#. For another embodiment, particular voltage ranges may be required to read the block lock-bits or the master lock-bit.

For another embodiment, the master lock-bit may control whether the block lock-bits may be read by microprocessor 102. For this embodiment, the block lock-bits may not be read if the master lock-bit is set unless the master override function is enabled. Similarly, the master lock-bit may not be read unless a particular voltage range is applied to one of the control signals (e.g., approximately 10.0 V to 13.0 V on RP#).

After the data is supplied on data bus 140 at step 1442, the process stops at step 1414.

Figure 15:
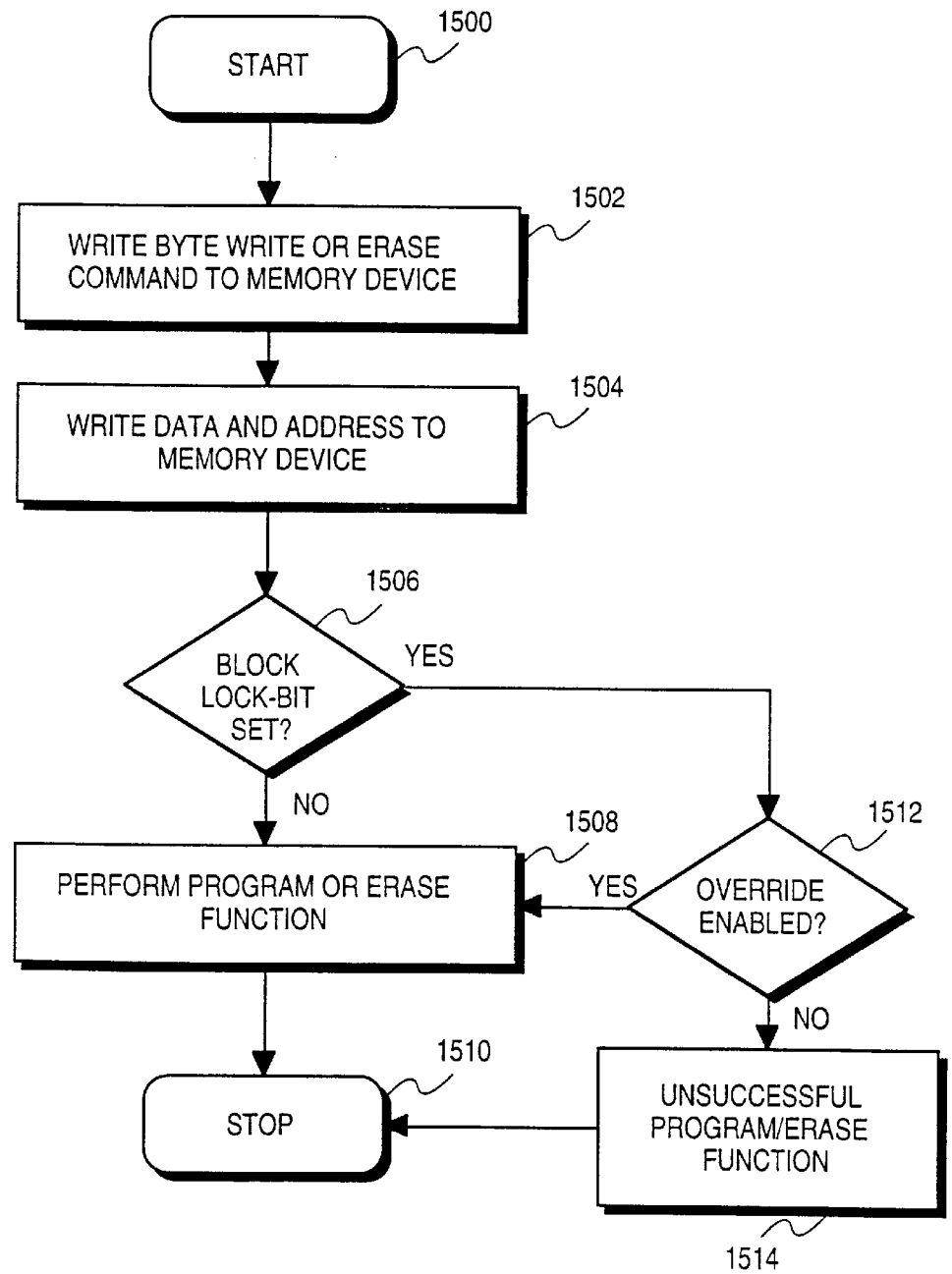
FIG. 15 is a flow chart of one embodiment of writing to a memory cell in the flash main array.

FIG. 15 illustrates one embodiment of writing (i.e., programming or erasing) a byte of flash memory cells in flash main array 104.

The process begins at step 1500. At step 1502, microprocessor 102 issues a BYTE WRITE (or BLOCK ERASE) command to flash memory device 100 via data bus 140. Command state machine 108 may then decode the command. Microprocessor 102 may then supply an address for the appropriate byte of memory cells in flash main array 104 and data to be written into the byte of memory cell (either programming or erasing).

At step 1506, command state machine 108 and/or write state machine 120 may determine if the corresponding block lock-bit is set in flash block lock mini-array 106 indicating whether the states of the byte of flash memory cells in flash main array 105 may be altered. As previously described, the address for the memory cell in flash main array 104 may be used to decode the memory block of the memory cell and to decode the corresponding block lock-bit in flash block lock mini-array 106.

Figure 16:
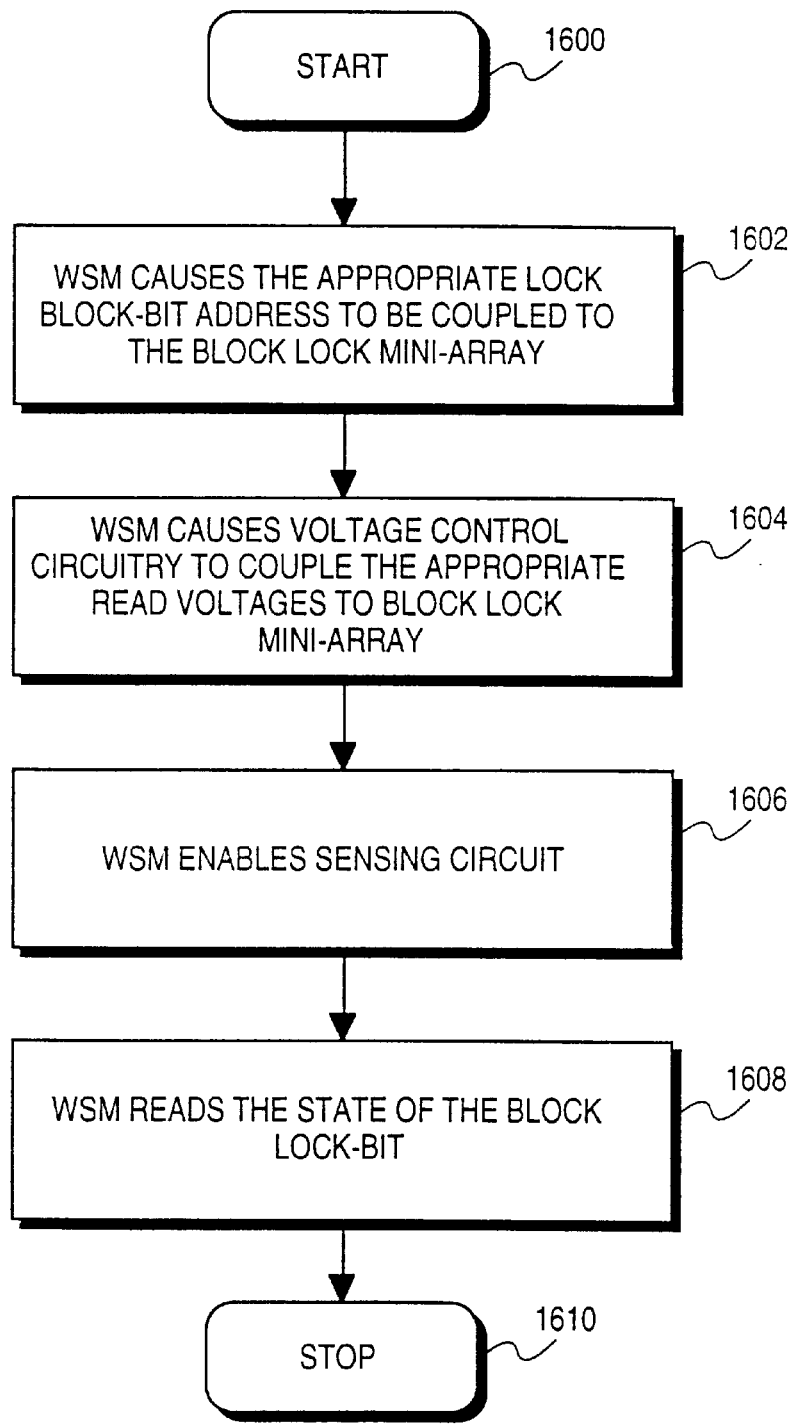
FIG. 16 is a flow chart of one embodiment of determining if a block lock-bit is set.

FIG. 16 illustrates one embodiment of step 1506. The process starts at step 1600. At step 1602, write state machine 120 receives a signal from command state machine 108 indicating that a BYTE WRITE command is to take place. Write state machine 120 sends a signal on line 174 to cause multiplexer 136 to couple the address on address bus 142 or latched in address latch 138 to Y decoding and gating circuitry 128 and X decoding circuitry 132.

At step 1604, write state machine 120 may cause voltage control circuitry 122 to couple appropriate read voltages to the addressed block lock-bit of flash block lock mini-array 106. At step 1606, write state machine 120 may then enable sense circuit 114 via control line 130 to sense the block lock-bit information from Y decoding and gating circuitry 128. At step 1608, write state machine 120 reads the state of the block lock-bit from sense circuit 114 via bus 168. The process stops at step 1610.

With respect to FIG. 15, if write state machine 120 determines that the block lock-bit is set, then write state machine 120 determines if an override function is enabled at step 1512. The override function may enable a user to update the byte of flash memory cells in flash main array 104 even though the corresponding block lock-bit in flash block lock mini-array 106 is set. For one embodiment, the override function may include applying a high voltage to RP# of approximately 10.0 V to 13.0 V. Other voltage ranges may be used. Write state machine 120 may receive the RP# directly from microprocessor 102, or it may receive RP# or a derivative signal from command state machine 108.

If the override function is enabled or the master lock-bit is not set, then at step 1508 write state machine 120 may cause the memory cell in flash main array 104 to be written and the process stops at step 1510. If the override is disabled, then the BYTE WRITE command is unsuccessful as indicated at step 1514, and the process stops at step 1510.

If the BYTE WRITE command is unsuccessful, then the status register 118 may be updated by write state machine 120 or command state machine 108 to reflect that the BYTE WRITE command was unsuccessful or was aborted. For example, one bit (e.g., bit 1) in status register 118 may reflect whether the BYTE WRITE command was successful. For one embodiment, if the bit is set to a logic one state, then the command was not completed successfully. If the bit is set to a logic zero state, then the command was completed successfully.

Another bit in status register 118 (e.g., bit 4) may indicate that the override function was not enabled when attempting to write to the byte of flash memory cells in flash main array 104 when the corresponding block lock-bit in flash block lock mini-array 106 was set. For one embodiment, if the bit is set to a logic one state, then the override function was not enabled. If the bit is set to a logic zero state, then the override function was enabled.

TABLE 2

| Operation | Master Lock-Bit | Block Lock-Bit | RP # | Effect |
| --- | --- | --- | --- | --- |
| BYTE WRITE or BLOCK ERASE | X | 0 | VIH or VHH | Operation Enabled |
| | | 1 | VIH | Block Locked Operation Disabled |
| | | | VHH | Block Lock-Bit Override Operation Enabled |
| SET BLOCK LOCK-BIT | 0 | X | VIH or VHH | Operation Enabled |
| | 1 | X | VIH | Master Lock-Bit Set Operation Disabled |
| | | | VHH | Master Lock-Bit Override Operation Enabled |
| SET MASTER LOCK-BIT | X | X | VIH | Operation Disabled |
| | | | VHH | Operation Enabled |
| CLEAR BLOCK LOCK-BITS | 0 | X | VIH or VHH | Operation Enabled |
| | 1 | X | VIH | Master Lock-Bit Set Operation Disabled |
| | | | VHH | Master Lock-Bit Override Operation Enabled |

Table 2 illustrates one embodiment of the effect that the master lock-bit, the block lock-bits, and RP# may have on BYTE WRITE, BLOCK ERASE, SET BLOCK LOCK-BIT, SET MASTER LOCK-BIT, and the CLEAR BLOCK LOCK-BITS commands. VIH is a minimum high voltage for RP#. For one embodiment VIH is a TTL level of approximately 2.0 V. For another embodiment, VIH is a CMOS level of approximately 3.0V or approximately VCC/2.

Flash memory device 100 may also support the use of a passcode to override the master lock-bit. For example, a passcode may be used for step 612 of FIG. 6, step 722 of FIG. 7, step 1112 of FIG. 11, or step 1222 of FIG. 12. Alternatively, a passcode may be used to override the block lock-bits. For example, a passcode may be used for step 1512 of FIG. 15.

The addition of a passcode to the block locking scheme allows a user to override the master lock-bit without using a high voltage pin (e.g., coupling VHH to RP#). When a device is in a circuit board or other system, it may be easier for the user to override the master lock-bit using a passcode rather than using the high voltage pin override because a passcode uses the existing bus structure of the system while a high voltage pin override may require a system reconfiguration. The passcode may be beneficial for updateable cell phones, motherboards, memory cards, BIOS, etc., where protection against modification is desired while retaining the option for future memory upgrades.

A passcode may constitute one or more bits (e.g., a byte of bits) and may be stored in memory arrays 104 or 106, or in other circuits or components within flash memory device 100. When a proper passcode is entered by the user, the master lock-bit override may be enabled in the same manner in which VHH is used to override the master lock-bit, as in, for example, FIGS. 7 and 12.

One or more passcodes may be stored in flash memory device 100. For example, one passcode may enable the master lock-bit override, and another passcode may enable override of a block lock-bit. Alternatively, each block lock-bit may have its own passcode and/or its own address in block lock mini-array 106.

Passcodes may be programmed, read, or otherwise entered directly by a user or under the control of microprocessor 102. Passcodes may be supplied by the manufacturer or they may be programmed into block lock mini-array 106. Programming a passcode using the PROGRAM PASSCODE command is shown in FIGS. 17 and 18.

Figure 17:
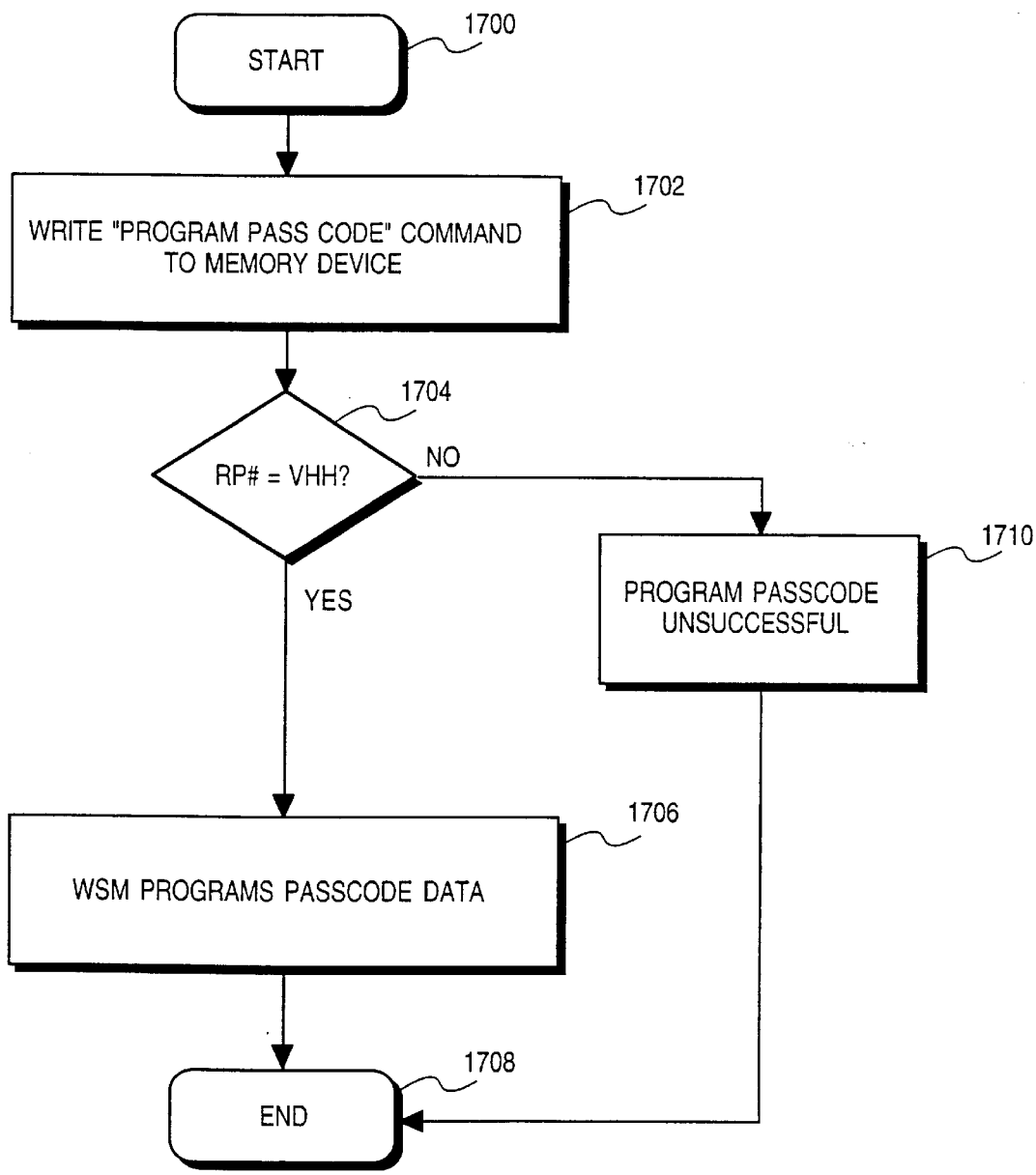
FIG. 17 is a flow chart of one embodiment of programming a passcode into a flash memory device.

The process of programming the passcode into flash memory device 100 is generally shown in FIG. 17 beginning with step 1700. At step 1702, the PROGRAM PASSCODE command is issued to flash memory device 100. Step 1704 determines if VHH is provided on RP# to enable this command. This may prevent a passcode from being inadvertently programmed while in a system configuration. Alternatively, other methods may be used to enable the PROGRAM PASSCODE command, including coupling different voltages to RP# besides VHH. If the command is not enabled, the PROGRAM PASSCODE command is unsuccessful as indicated at step 1710, and the process ends at step 1708. If the command is enabled (e.g. RP#=VHH), write state machine 120 programs the passcode into block lock mini-array 106 at step 1706, and the PROGRAM PASSCODE command is completed successfully at step 1708.

Figure 18:
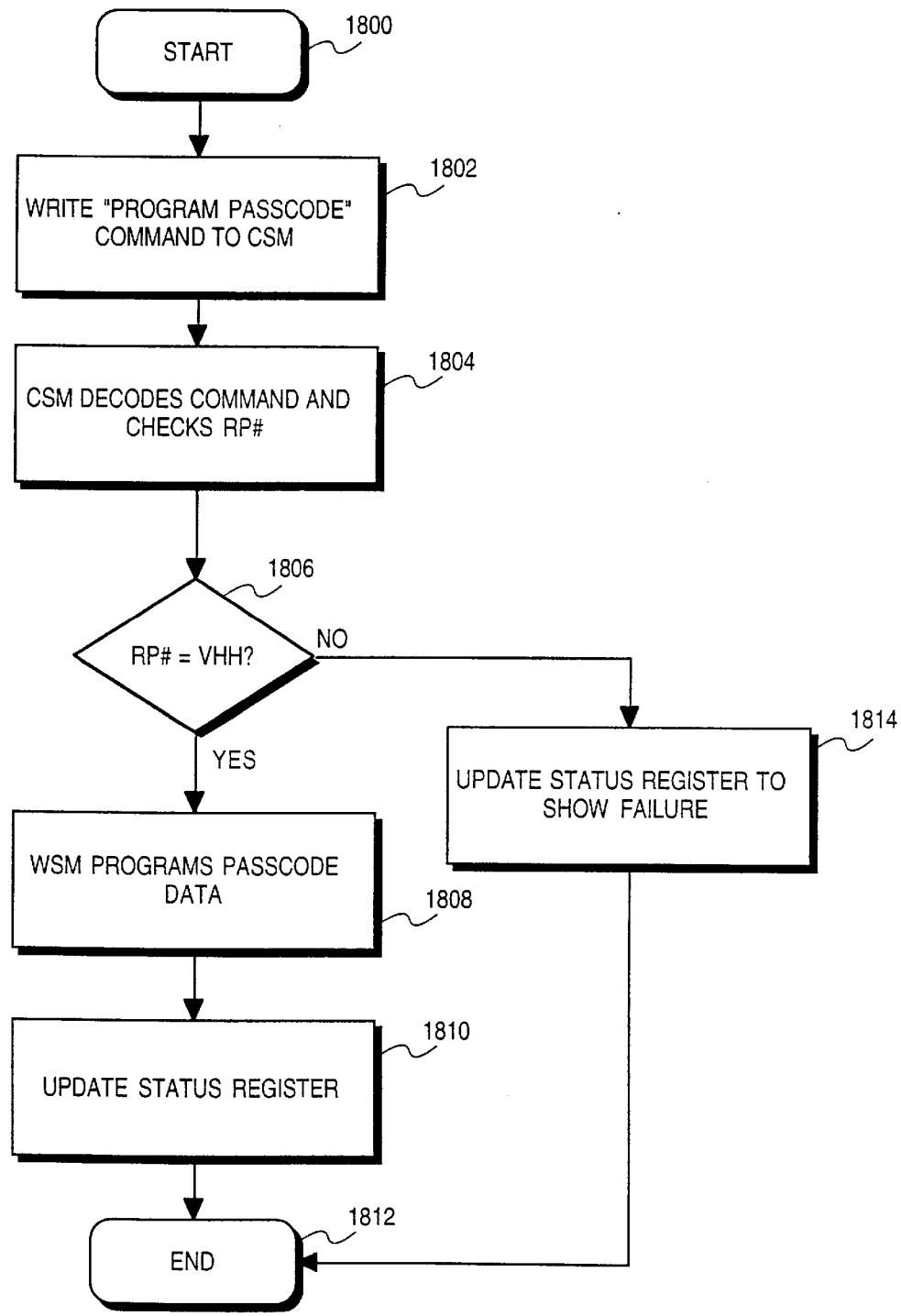
FIG. 18 is a flow chart of another embodiment of programming a passcode into a flash memory device.

FIG. 18 illustrates a more detailed embodiment of programming the passcode in flash memory device 100. The process begins at step 1800. At step 1802, microprocessor 102 issues a PROGRAM PASSCODE command to command state machine 108 via data bus 140. At step 1804, command state machine 108 may then decode the command and check the voltage level on RP#. At step 1806, command state machine 108 determines if RP#=VHH, that is, if the PROGRAM PASSCODE command is enabled. Alternative embodiments may use other methods to enable the PROGRAM PASSCODE command. If the command is not enabled, the PROGRAM PASSCODE command is unsuccessful and the process transitions to step 1814. At step 1814, status register 118 may be updated to indicate that the command was unsuccessful, and the process ends at step 1812. If the command is enabled, write state machine 120 programs the passcode into block lock mini-array 106 at step 1808. The passcode may be provided on data bus 140. Alternatively, an address for the passcode in block lock mini-array 106 may be provided on address bus 142 together with the passcode. Status register 118 may then be updated to indicate that the command was successful at step 1810, and the process ends at step 1812.

Figure 19:
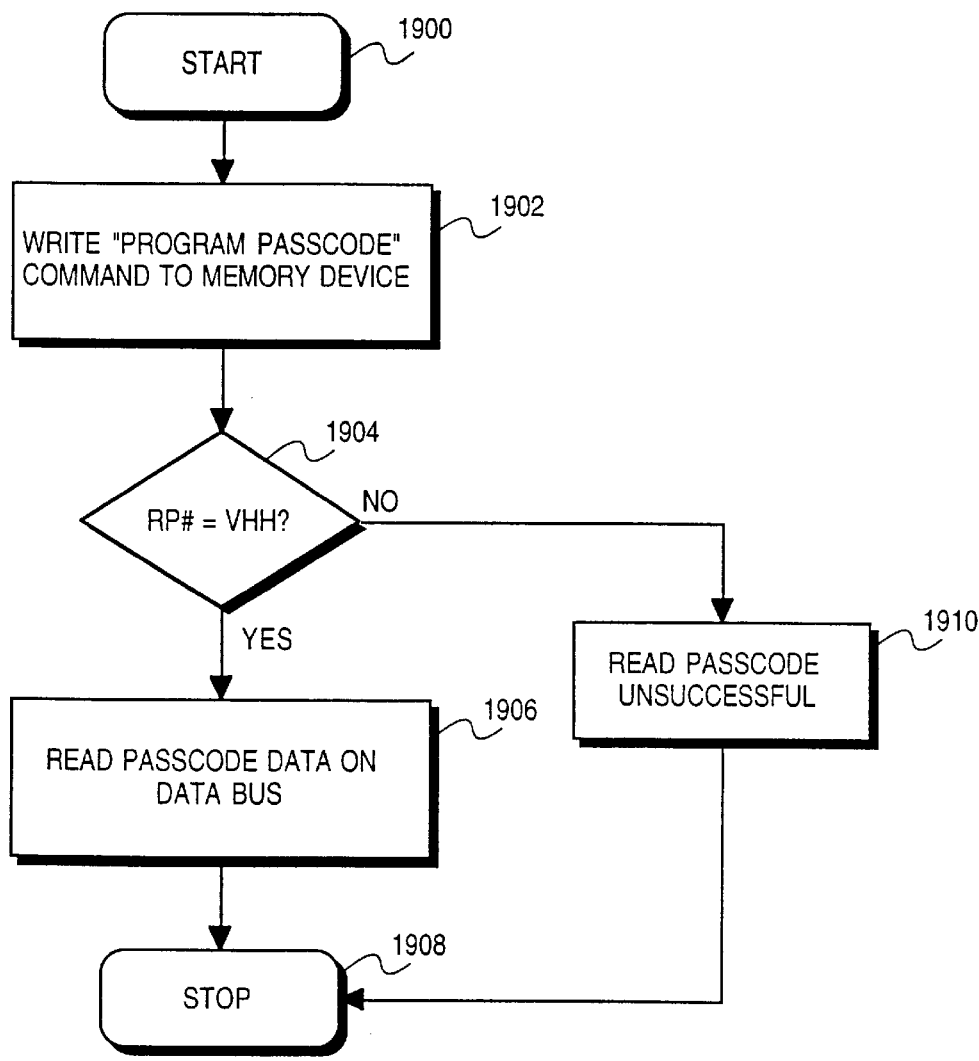
FIG. 19 is a flow chart of one embodiment of reading a passcode from a flash memory device.
Figure 20:
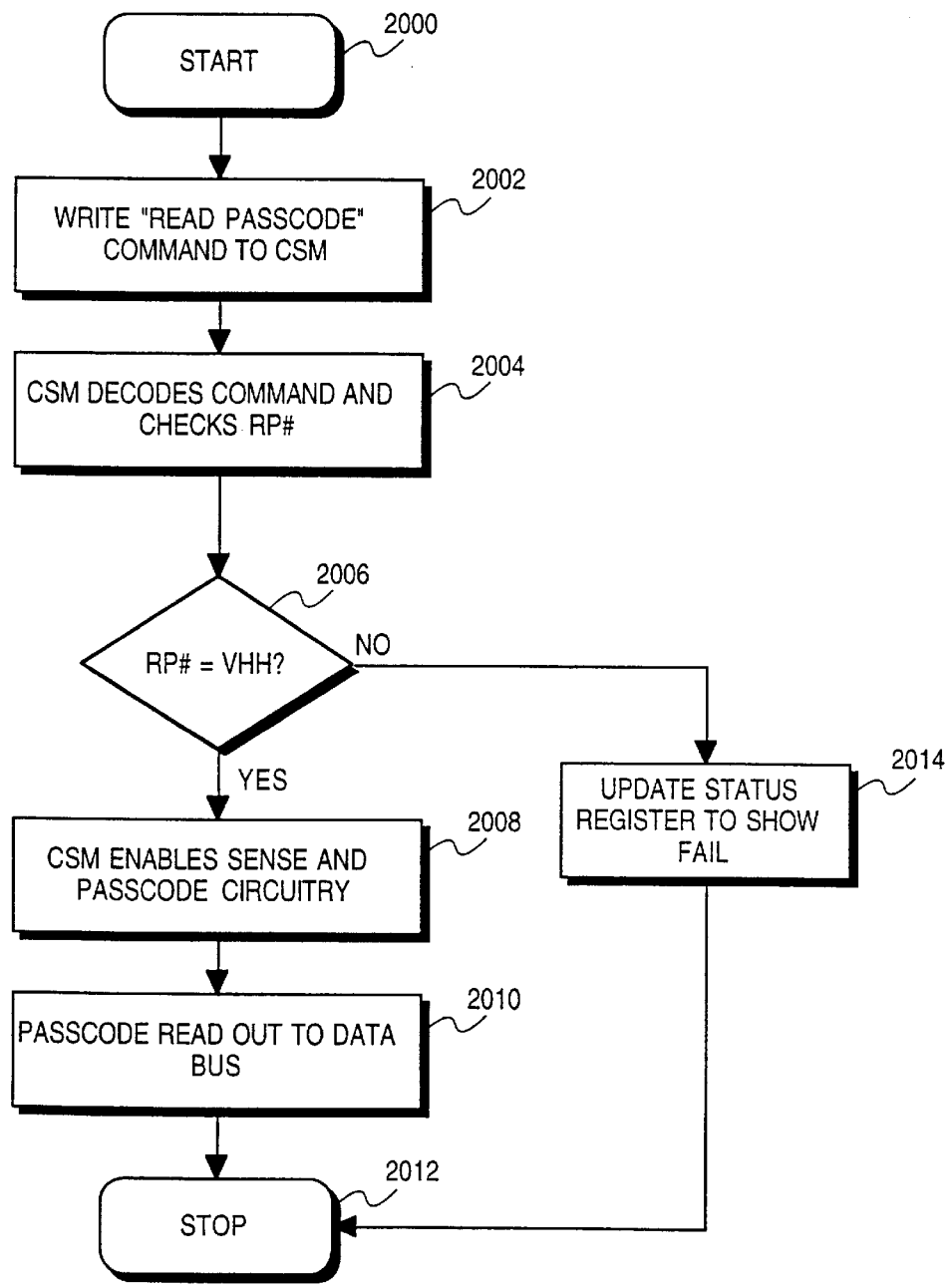
FIG. 20 is a flow chart of another embodiment of reading a passcode from a flash memory device.

Programming the passcode may be verified using the READ PASSCODE command as shown in FIGS. 19 and 20. The read passcode process is generally shown in FIG. 19 beginning with step 1900. At step 1902, the READ PASSCODE command is issued to flash memory device 100. Step 1904 determines if VHH is present on RP# to enable this command. This may prevent the passcode from being easily read out once the device is mounted on a circuit board or in a system. Alternative embodiments may use other methods to enable the READ PASSCODE command, including coupling different voltages besides VHH to RP#. If the command is not enabled, the READ PASSCODE command is unsuccessful as indicated at step 1910, and the process ends at step 1908. If the command is enabled (e.g., RP#=VHH) write state machine 120 may then cause the passcode to be read out from block-lock mini-array 106 to data bus 140. The READ PASSCODE command is then completed successfully at step 1908.

FIG. 20 illustrates a more detailed embodiment of reading the passcode from flash memory device 100. The process begins at step 2000. At step 2002, microprocessor 102 issues a READ PASSCODE command to command state machine 108 via data bus 140. Command state machine 108 may then decode the command and check the voltage on RP#. At step 2006, command state machine 108 determines if RP#=VHH, that is, if the READ PASSCODE command is enabled. Alternative embodiments may use other methods to enable the READ PASSCODE command. If the command is not enabled at step 2006, the READ PASSCODE command is unsuccessful and the process transitions to step 2014. At step 2014, status register 118 may be updated to indicate that the command was unsuccessful, and the process ends at step 2012. If the command is enabled, write state machine 120 may then cause voltage control circuitry 122 to place block-lock mini-array 106 into read configuration and enable sense circuit 114. An address for the passcode may be optionally provided onto address bus 142 and coupled to block-lock mini-array 106 via multiplexer 136. At step 2010, Y decoding and gating circuitry 128 outputs the passcode through sense circuit 114 and output multiplexer 110 to data bus 140. The READ PASSCODE command is then completed successfully at step 2012.

Figure 21:
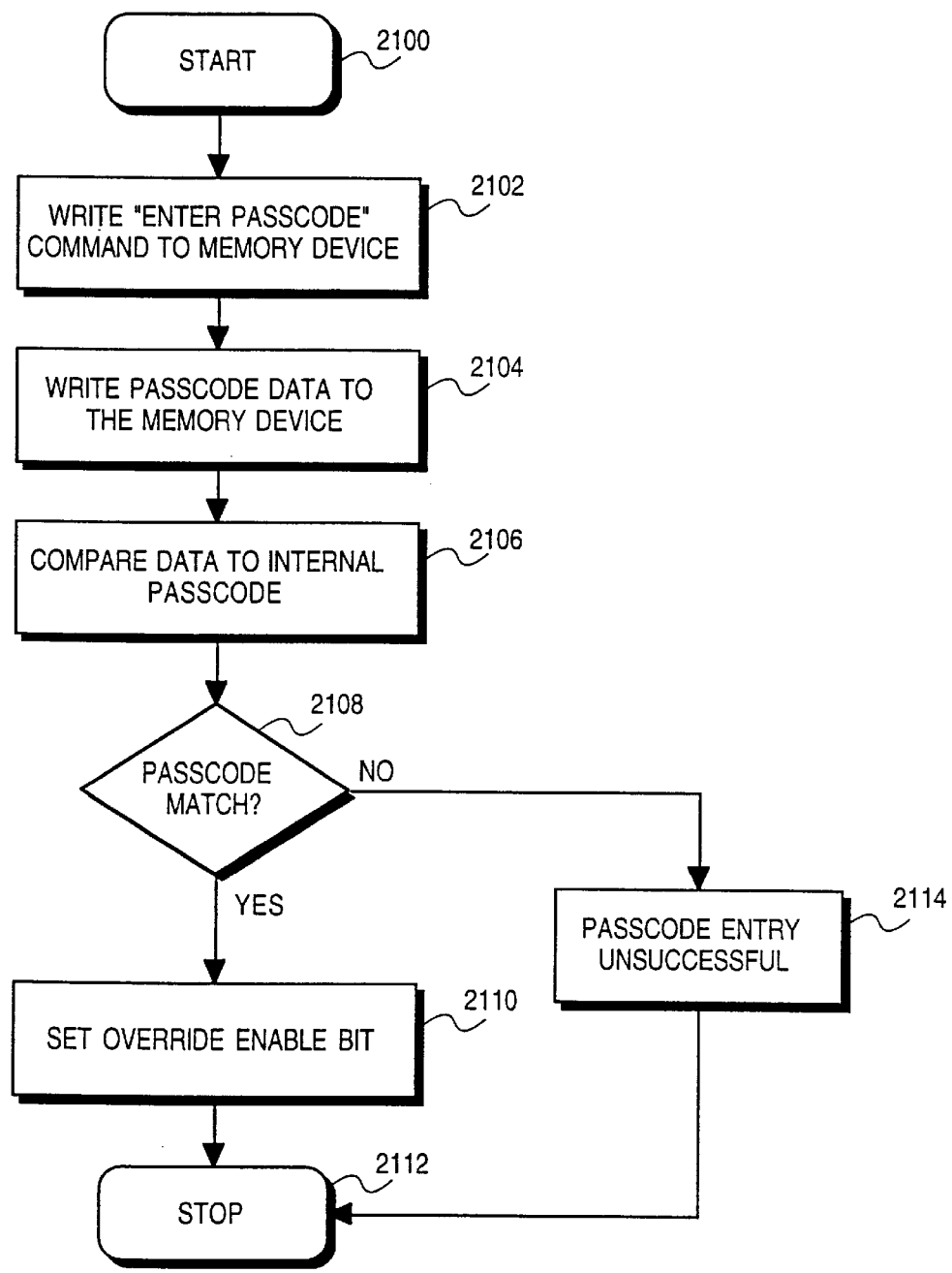
FIG. 21 is a flow chart of one embodiment of determining if an override function is enabled using a passcode.
Figure 22:
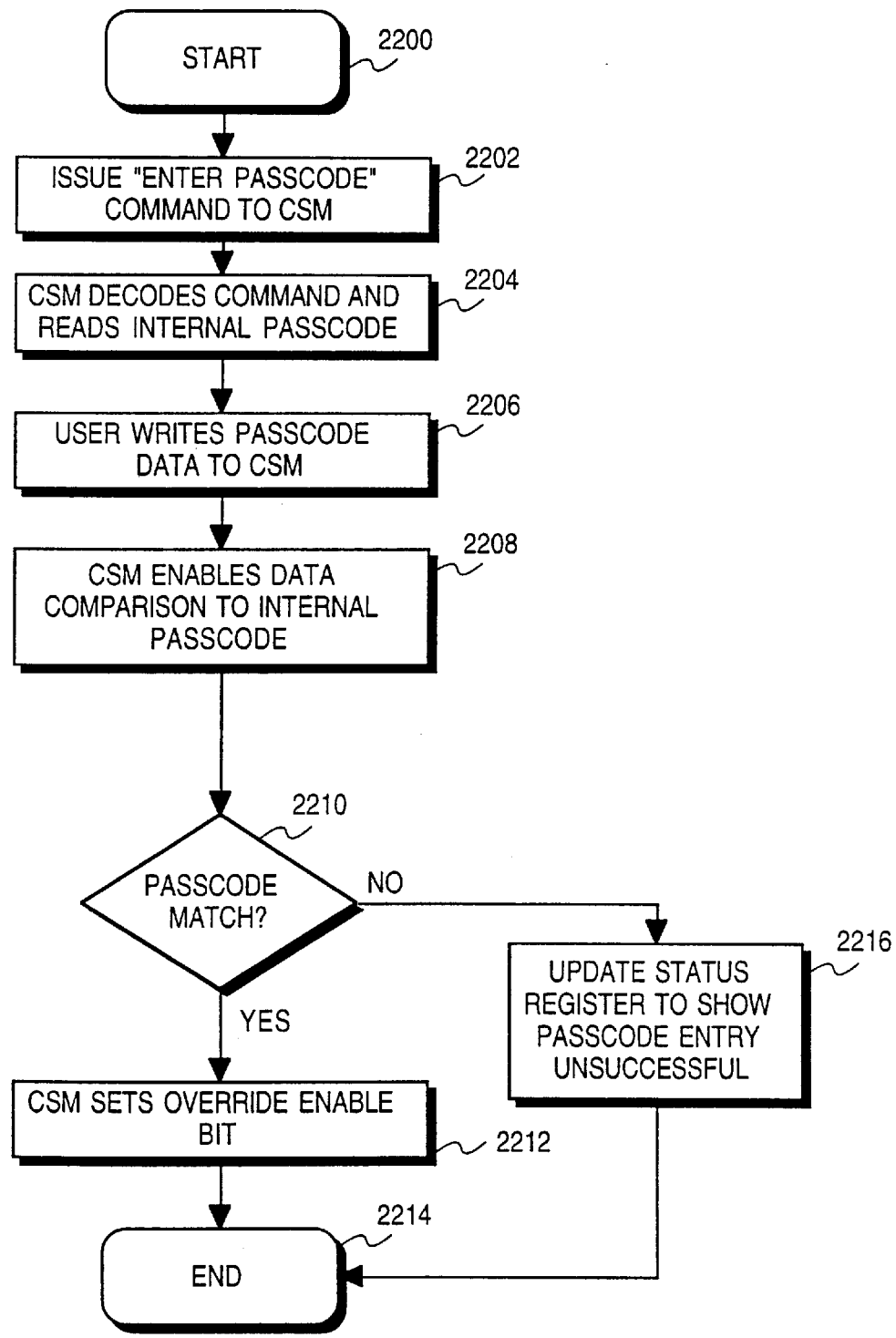
FIG. 22 is a flow chart of another embodiment of determining if an override function is enabled using a passcode.

A passcode override may be performed using the ENTER PASSCODE command as shown in FIGS. 21 and 22. Once entered, the user entered passcode can be compared to the stored passcode using software, comparison circuits, or other means. For one embodiment, comparison may be performed within write state machine 120.

When the passcode data is found to match the internal passcode, an override enable bit may be updated allowing the user to clear block lock-bits otherwise locked by the master lock-bit. The override enable bit may reside in write state machine 120, command state machine 108, in memory arrays 106 or 134, or any other circuit in flash memory device 100. Alternatively, the override enable bit may comprise a separate circuit within flash memory device 100.

The enter passcode process is generally shown in FIG. 21 beginning with step 2100. At step 2102 the ENTER PASSCODE command is issued to flash memory device 100. At step 2104, the user enters passcode data to flash memory device 100. Step 2106 compares the user passcode to the internal passcode, and step 2108 determines if they match. If the user passcode does not match the internal passcode, the ENTER PASSCODE command is unsuccessful as indicated at step 2114, and the process ends at step 2112. If the user data matches the passcode at step 2108, the ENTER PASSCODE command is successful and the override enable bit is set in step 2110. The process ends at step 2112.

FIG. 22 illustrates a more detailed embodiment of entering the passcode in flash memory device 100. The process starts at step 2200. At step 2202, microprocessor 102 issues the ENTER PASSCODE command to command state machine 108 via data bus 140. Command state machine 108 may then decode the command and cause the internal passcode at step 2204 to be read from block-lock mini-array 106 at step 2204. At step 2206, microprocessor 102 issues the passcode data provided by the user or system to command state machine 108. At step 2208, write state machine 120 (or other circuitry) compares the user passcode to the internal passcode. Alternative embodiments may use other methods to compare the user passcode data to the internal passcode. If the user passcode does not match the internal passcode at step 2210, the ENTER PASSCODE command is unsuccessful and the process transitions to step 2216. Command state machine 108 or write state machine 120 may then update status register 118 at step 2216 to indicate the command was unsuccessful, and the process ends at step 2214. If the user passcode matches the internal passcode at step 2210, the ENTER PASSCODE command is successful, and command state machine 108 or write state machine 120 sets the override enable bit at step 2212. Status register 118 may be optionally updated at step 2212 to indicate the command was successful. The process ends at step 2214.

It may be desirable for users to have the ability to read out passcodes for verification purposes after a new passcode has been entered. For one embodiment the passcode scheme may include safeguards to prevent tampering by either reading the passcode or programming new passcodes. Optionally, a configuration bit could be used to prevent reading or programming the passcode to prevent tampering once the codes have been programmed and verified to be correct.

The passcode scheme may also include circuitry to protect against passcode breaking. This may include lockout circuitry (preventing master lock override after a specified number of failing passcode attempts), encryption hardware or software, passcodes of long length to make the odds of matching very small, and other circuitry.

The addition of configuration bits to the block locking scheme may allow a manufacturer and a user to modify device operation to suit specific needs. An example of this is the ability to prevent programming of passcode bits once the user has programmed and verified the passcode in the device. Other uses for configuration bits include setting the level of user access to the master lock-bit, setting passcode protection schemes, disabling high VHH overrides, and other uses. Configuration bits may also be configured to be completely accessible (read/write), read only, or completely inaccessible as the user desires. Configuration bits may be overridden using a high voltage pin or through other means. Configuration bits may be stored within any circuitry with flash memory device 100, and may be accessible by a user directly or via microprocessor 102.

Figure 23:
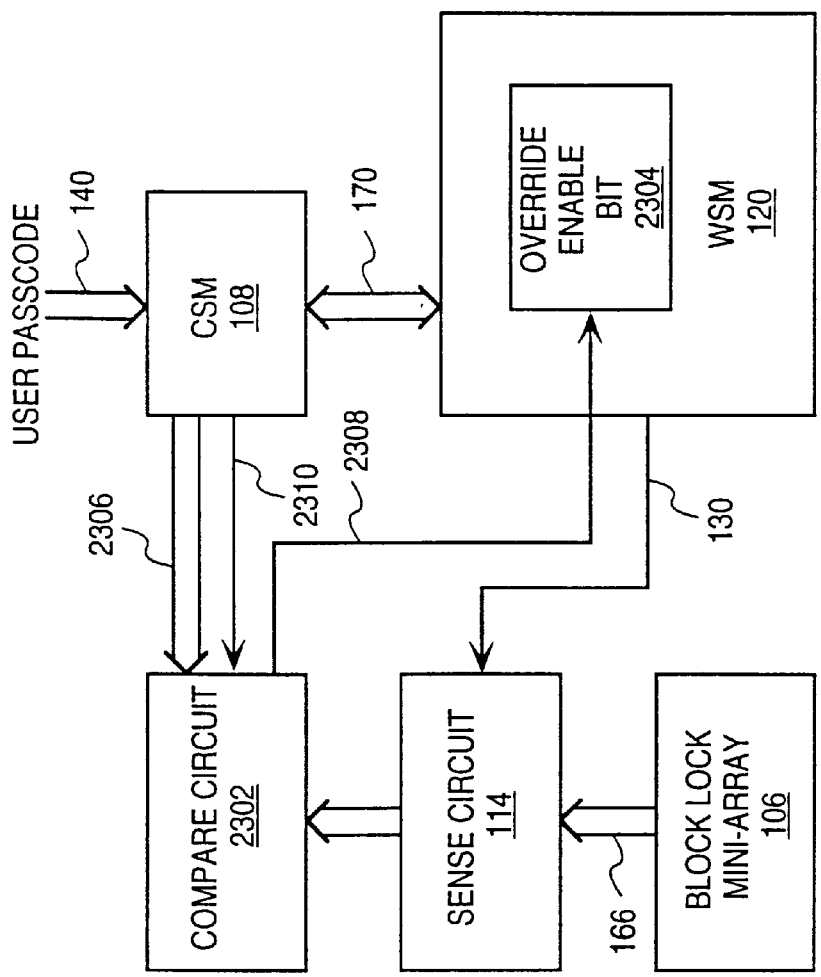
FIG. 23 is one embodiment of a flash memory device including compare circuitry and an override enable bit.

One embodiment of flash memory device 100 including compare circuitry is illustrated in FIG. 23. FIG. 23 is a simplified drawing of flash memory device 100 including command state machine 108, sense circuit 114, block lock mini-array 106, compare circuit 2302, and write state machine 120. The operation of FIG. 23 may be described with reference to FIG. 22. The process begins at step 2200. At step 2202, the ENTER PASSCODE command is issued to command state machine 108 via data bus 140. At step 2204, command state machine 108 decodes the command and enables the internal passcode to be read from block lock mini-array 106 through sense circuit 114 to compare circuit 2302. Alternatively, command state machine 108 enables write state machine 120 to cause the reading of the internal passcode from block lock mini-array 106. At step 2206, the microprocessor 102 (or the user) writes passcode to command state machine 108. At step 2208, command state machine 108 couples the user passcode to compare circuit 2302 via bus 2306 and enables compare circuit 2302 via line 2310 to compare the user passcode with the internal passcode. At step 2210, compare circuitry 2302 compares the user passcode and an internal passcode. If there is no match, than status registers 118 may be updated to reflect the unsuccessful attempt. If there is a match, the compare circuit may send a signal on line 2308 that updates the override enable bit 2304 in write state machine 120 to enable the override of the master lock-bit.

It will be appreciated that the passcode commands and circuitry described herein may be used in other types of memory devices besides flash memory devices. For example, the passcode commands and circuitry may be used in RAMs, ROMs, programmable logic devices, or other types of memory devices to control an override function of a master lock-bit, block lock-bit(s), or their equivalents.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory device comprising:
   a first flash memory array including a plurality of memory blocks each having a memory cell;
   control circuitry coupled to the first memory array and controlling updating of the memory cells; and
   a second independent flash memory array coupled to the control circuitry and including a plurality of block lock-bits each corresponding to one of the plurality of memory blocks, wherein each block lock-bit controls updating of the corresponding memory block.

2. The memory device of claim 1, wherein the memory cell is a nonvolatile memory cell.

3. The memory device of claim 1, wherein the state of each block lock-bit indicates whether data may be programmed into the memory cell in the corresponding memory block.

4. The memory device of claim 1, wherein the state of each block lock-bit indicates whether data stored in the memory cell in the corresponding memory block may be erased.

5. The memory device of claim 1, wherein the second independent flash memory array further comprises a master lock-bit, wherein the master lock-bit indicates whether the plurality of block lock-bits are locked.

6. The memory device of claim 5, wherein the memory device is configured to receive a passcode, wherein the passocde overrides the master lock-bit so as to unlock the plurality of block lock-bits.

7. The memory device of claim 5, wherein the state of the master lock-bit indicates whether the plurality of lock-bits may be programmed.

8. The memory device of claim 5, wherein the state of the master lock-bit indicates whether the plurality of lock-bits may be erased.

9. The memory device of claim 1, wherein the control circuitry controls writing the block lock-bits.

10. The memory device of claim 9, wherein the control circuitry controls erasing the block lock-bits.

11. The memory device of claim 1, wherein the control circuitry includes a master lock-bit, wherein the master lock-bit indicates whether the plurality of lock-bits are locked.

12. The memory device of claim 1, wherein the control circuitry comprises:

a command circuit configured to receive and decode commands;

a write circuit coupled to the command circuit and configured to control execution of at least one of the commands; and a voltage control circuit coupled to the write circuit and configured to couple program or erase voltages to the first or second memory array.

13. The memory device of claim 1, wherein the control circuitry further controls reading the plurality of block lock-bits.

14. The memory device of claim 1, wherein the block lock-bits each comprise a nonvolatile memory cell.

15. A memory system comprising:

the memory device of claim 1; and a processing device coupled to the memory device and coupling commands to the memory device.

16. A memory system comprising:

a memory device having a first flash memory array including a plurality of memory blocks each having a memory cell;

a processing device coupled to the memory device and coupling commands to the memory device; and a second flash memory array coupled to the memory device and including a plurality of block lock-bits each corresponding to one of the plurality of memory blocks in the memory device, wherein each block lock-bit controls updating of the memory cell in the corresponding memory block, and wherein the block lock-bits retain their states when the memory cell in one of the memory blocks is erased.

17. The memory system of claim 16, wherein the second flash memory array further comprises a master lock-bit, wherein the master lock-bit indicates whether the plurality of lock-bits are locked.

18. The memory system of claim 17, wherein the memory device is configured to receive a passcode, wherein the passcode overrides the master lock-bit so as to unlock the plurality of block lock-bits.

* * * * *